US007985476B2

(12) United States Patent
Kurino et al.

(10) Patent No.: US 7,985,476 B2
(45) Date of Patent: Jul. 26, 2011

(54) TRANSPARENT ZIRCONIA DISPERSION AND ZIRCONIA PARTICLE-CONTAINING RESIN COMPOSITION, COMPOSITION FOR SEALING LIGHT EMITTING ELEMENT AND LIGHT EMITTING ELEMENT, HARD COAT FILM AND OPTICAL FUNCTIONAL FILM AND OPTICAL COMPONENT, AND METHOD FOR PRODUCING ZIRCONIA PARTICLE-CONTAINING RESIN

(75) Inventors: Yasuyuki Kurino, Tokyo (JP); Toru Kinoshita, Chiyoda-ku (JP); Naoki Takamiya, Chiyoda-ku (JP); Yoshitaka Yamamoto, Chiyoda-ku (JP); Tsuyoshi Kawase, Chiyoda-ku (JP); Yoshizumi Ishikawa, Chiyoda-ku (JP); Yoichi Sato, Chiyoda-ku (JP); Ryosuke Nakamura, Chiyoda-ku (JP); Yuko Katsube, Chiyoda-ku (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 498 days.

(21) Appl. No.: 12/084,093
(22) PCT Filed: Oct. 24, 2006
(86) PCT No.: PCT/JP2006/321092
§ 371 (c)(1),
(2), (4) Date: Apr. 24, 2008
(87) PCT Pub. No.: WO2007/049573
PCT Pub. Date: May 3, 2007

(65) Prior Publication Data
US 2009/0140284 A1 Jun. 4, 2009

(30) Foreign Application Priority Data

Oct. 28, 2005 (JP) ................................. 2005-314204
Dec. 22, 2005 (JP) ................................. 2005-369159
Feb. 17, 2006 (JP) ................................. 2006-041094
Mar. 29, 2006 (JP) ................................. 2006-089917
May 1, 2006 (JP) ................................. 2006-127565
May 19, 2006 (JP) ................................. 2006-140268

(51) Int. Cl.
*B32B 5/16* (2006.01)
*C09K 3/10* (2006.01)
*G02B 1/00* (2006.01)

(52) U.S. Cl. ................. 428/403; 252/182.12; 252/182.3; 252/363.5; 252/518.1; 252/519.3; 252/519.31; 252/519.33; 252/584

(58) Field of Classification Search ................... 428/403; 252/182.12, 182.3, 363.5, 518.1, 519.3, 219.31, 252/519.33, 584
See application file for complete search history.

(56) References Cited

U.S. PATENT DOCUMENTS
5,777,433 A 7/1998 Lester et al.
(Continued)

FOREIGN PATENT DOCUMENTS
EP 1 369 935 12/2003
(Continued)

OTHER PUBLICATIONS
European Search Report from EP 06812152.4 dated Sep. 2, 2010.
(Continued)

*Primary Examiner* — H. (Holly) T Le
(74) *Attorney, Agent, or Firm* — Merchant & Gould P.C.

(57) ABSTRACT

The present invention provides a transparent inorganic oxide dispersion which makes it possible to improve the refractive index and mechanical characteristics and to maintain transparency by modifying the surface of inorganic oxide particles with a surface modifier having one or more reactive functional groups; and an inorganic oxide particle-containing resin composition in which the transparent inorganic oxide dispersion and a resin are compositely integrated by the polymerization reaction, a composition for sealing a light emitting element, a light emitting element, and a method for producing an inorganic oxide particle-containing resin composition; and a hard coat film which has high transparency and makes it possible to improve a refractive index and tenacity, an optical functional film, an optical lens and an optical component. The transparent inorganic oxide dispersion of the present invention comprises inorganic oxide particles which have a surface modified with a surface modifier having one or more reactive functional groups and have a disperse particle diameter of 1 nm or more and 20 nm or less, and a disperse medium, wherein the surface modifier is one or more kinds selected from the group consisting of a silane coupling agent, a modified silicone, and a surfactant.

30 Claims, 2 Drawing Sheets

U.S. PATENT DOCUMENTS

| | | | |
|---|---|---|---|
| 6,521,677 B2 * | 2/2003 | Yashiro et al. | 523/212 |
| 6,686,047 B2 * | 2/2004 | Yamaguchi et al. | 428/407 |
| 7,491,441 B2 * | 2/2009 | Pokorny et al. | 428/328 |
| 2002/0019461 A1 | 2/2002 | Yashiro et al. | |
| 2002/0058737 A1 | 5/2002 | Nishiwaki et al. | |
| 2003/0065050 A1 | 4/2003 | Yamaguchi et al. | |
| 2003/0099824 A1 | 5/2003 | Yamaguchi et al. | |
| 2003/0105189 A1 * | 6/2003 | Yashiro et al. | 523/200 |
| 2004/0254282 A1 | 12/2004 | Suzuki et al. | |
| 2005/0059766 A1 | 3/2005 | Jones et al. | |
| 2005/0082691 A1 | 4/2005 | Ito et al. | |
| 2005/0200278 A1 | 9/2005 | Jones et al. | |
| 2006/0115669 A1 | 6/2006 | Shinohara et al. | |
| 2006/0147702 A1 * | 7/2006 | Pokorny et al. | 428/328 |

FOREIGN PATENT DOCUMENTS

| | | |
|---|---|---|
| EP | 1 447 427 | 8/2004 |
| JP | 5-171012 | 7/1993 |
| JP | 11-302597 | 11/1999 |
| JP | 2000-143924 | 5/2000 |
| JP | 2000-186216 | 7/2000 |
| JP | 2000-248198 | 9/2000 |
| JP | 2001-49077 | 2/2001 |
| JP | 2001-187812 | 7/2001 |
| JP | A-2003-012933 | 1/2003 |
| JP | 2003-119207 | 4/2003 |
| JP | 2003-183537 | 7/2003 |
| JP | 2004-1393 | 1/2004 |
| JP | 2004-269644 | 9/2004 |
| JP | 2004-292779 | 10/2004 |
| JP | 2005-068234 | 3/2005 |
| JP | 2005-105217 | 4/2005 |
| JP | 2005-120230 | 5/2005 |
| JP | 2005-161111 | 6/2005 |
| JP | A-2005-288712 | 10/2005 |
| JP | A-2005-301241 | 10/2005 |
| JP | A-2005-307178 | 11/2005 |
| JP | A-2005-343119 | 12/2005 |
| JP | T-2007-532589 | 11/2007 |
| JP | 2010-189506 | 9/2010 |
| WO | WO 00/27931 | 5/2000 |
| WO | WO 01/12690 | 2/2001 |
| WO | WO 01/48073 | 7/2001 |
| WO | WO 2004/078855 | 9/2004 |
| WO | WO 2005/099652 A1 | 10/2005 |
| WO | WO 2006/073773 | 7/2006 |
| WO | WO 2006/098899 | 9/2006 |

OTHER PUBLICATIONS

Japanese Office Action for Japanese Patent Application No. 2005-369159 (Mar. 15, 2011).

* cited by examiner

TRANSPARENT ZIRCONIA DISPERSION AND ZIRCONIA PARTICLE-CONTAINING RESIN COMPOSITION, COMPOSITION FOR SEALING LIGHT EMITTING ELEMENT AND LIGHT EMITTING ELEMENT, HARD COAT FILM AND OPTICAL FUNCTIONAL FILM AND OPTICAL COMPONENT, AND METHOD FOR PRODUCING ZIRCONIA PARTICLE-CONTAINING RESIN

TECHNICAL FIELD

The present invention relates to a transparent inorganic oxide dispersion; an inorganic oxide particle-containing resin composition; a composition for sealing a light emitting element; a light emitting element; and a method for producing an inorganic oxide particle-containing resin composition. More particularly, the present invention relates to a transparent inorganic oxide dispersion which is preferably used as a filler material of a resin, and makes it possible to improve the refractive index and mechanical characteristics and to maintain transparency; an inorganic oxide particle-containing resin composition in which the transparent inorganic oxide dispersion and a resin are compositely integrated by a polymerization reaction; a composition for sealing a light emitting element; a light emitting element; and a method for producing an inorganic oxide particle-containing resin composition.

Also, the present invention relates to a composition for sealing a light emitting element which makes it possible to maintain transparency suited for use as a sealing material and to improve a refractive index and mechanical characteristics; a light emitting element which makes it possible to improve light extraction efficiency by sealing a light transmitting region with the composition for sealing a light emitting element, thereby obtaining high luminescent brightness; and an optical semiconductor device comprising a light emitting element.

Also, the present invention relates to an inorganic oxide particle-containing resin composition containing a zirconia-containing epoxy resin composition used in a light emitting diode (LED); a light emitting element containing the same; and an optical semiconductor device. More particularly, the present invention relates to a zirconia-containing epoxy resin composition used to realize a high refractive index of a light emitting diode; an inorganic oxide particle-containing resin composition containing the same; a light emitting element which improves light extraction efficiency by sealing a light transmitting region using the inorganic oxide particle-containing resin composition thereby obtaining high luminescent brightness; and an optical semiconductor device comprising the light emitting element.

Also, the present invention relates to an inorganic oxide particle-containing transparent plastic member (fine zirconia transparent plastic member) and a composite plastic member. More particularly, the present invention relates to an inorganic oxide particle-containing transparent plastic member (fine zirconia transparent plastic member) which can realize both a high refractive index and high transparency and also improve mechanical characteristics by compositing fine zirconia particles with various plastic members; and a composite plastic member.

Also, the present invention relates to a hard coat film; an optical functional film; an optical lens; and an optical component. More particularly, the present invention relates to a hard coat film which has a high light transmittance to visible light and can improve the refractive index and tenacity; an optical functional film which has a high light transmittance and is also excellent in the refractive index and tenacity by comprising the hard coat film; an optical lens which is excellent in light transmittance, the refractive index and tenacity by comprising the hard coat film; and an optical component comprising the optical lens.

BACKGROUND ART

There has hitherto been made a trial of improving mechanical characteristics of a resin by compositing an inorganic oxide such as silica as a filler with a resin. As the method of compositing the filler with the resin, a method of mixing a dispersion containing an inorganic oxide dispersed in water and/or an organic solvent with a resin is usually used. By mixing the dispersion with the resin using various methods, an inorganic oxide particle composite plastic comprising inorganic oxide particles composited as a second phase can be prepared.

On the other hand, as a substrate for flat panel displays (FPD) such as a liquid crystal display (LCD), a plasma display (PDP), or an electroluminescence display (EL), a glass substrate has often been used. This glass substrate has such a problem that it is not suited for weight saving since it is easily broken and cannot be bent, and also has a large specific gravity. Thus, there has often been made a trial of using a plastic substrate having flexibility in place of the glass substrate.

Examples of characteristics required to the plastic substrate for a flat panel display (FPD) include transparency, a refractive index, and mechanical characteristics.

As an inorganic oxide filler for improving the refractive index of the plastic, fine oxide particles made of zirconia and titania are used as a high refractive index filler.

A dispersion containing the inorganic oxide filler in an aqueous solvent or an organic solvent is developed so as to composite the inorganic oxide filler with the resin, and an improvement in the refractive index of the resin is now studied.

As an example of compositing, there is proposed a high refractive index/high transparency film having a thickness of several microns using a zirconia particle composite plastic obtained by compositing zirconia particles having a particle diameter of 10 to 100 nm with a resin (see, for example, Patent Document 1).

As a light emitting element in optical semiconductor devices such as an optical pickup used in a CD, a CD-ROM, a CD-Video, an MO, a CD-R, and a DVD, and various display devices and display equipment, there has widely been used a light emitting diode (LED) which emits light in a visible region, an ultraviolet region or an infrared region by using a forwardly biased pn-junction region as a light-emitting region and recombining electrons and holes in the light-emitting region.

In this light emitting diode, a LED chip obtained by laminating gallium nitride-based compound semiconductors is loaded on a lead frame and the LED chip is electrically connected to the lead frame, and the LED chip is sealed with a resin which exerts both a protective function and a lens function.

In the light emitting diode, when a gallium nitride (GaN)-based compound semiconductor is used as the light emitting layer, the optical refractive index of the light emitting layer is about 2.

As the resin used for sealing, transparency, mechanical strength, and tenacity are required. Therefore, as a resin suited for these requirements, a silicone resin having a refractive index of about 1.4 is widely used (see, for example, Patent Documents 2 and 3).

The resin is composited with an inorganic oxide such as silica as a filler so as to improve mechanical characteristics of the resin.

The method of compositing the resin with the filler includes, for example, a method of dispersing the filler in the resin by mixing a dispersion containing an inorganic oxide in water and/or an organic solvent with the resin using various methods.

In an LED, a semiconductor device is sealed with a transparent sealing resin such as an epoxy resin or a silicone resin so as to protect the semiconductor device. However, there was such a problem that the sealing resin causes yellowing and luminance of the LED decreases since energy emitted from the LED increases with the increase of requirements of realization of a short wavelength and a high luminance of the LED.

When a silicone resin is used as a sealing resin of an LED, the silicone resin is excellent in heat resistance and light resistance and is insufficient in adhesion with the semiconductor device, and also has a low refractive index, thus causing a problem that efficiency of light extraction from the LED decreases.

As the epoxy resin, a bisphenol A type epoxy resin (an epi-bis type resin) and a cresol novolak type epoxy resin are used. The epoxy resin has a property capable of easily absorbing ultraviolet light since it has a benzene ring, namely, an unsaturated bond.

Therefore, the epoxy resin had such a problem that a radical generated by energy of absorbed ultraviolet light may cause oxidation of the epoxy resin, resulting in yellowing.

As a means for solving such a problem, there is proposed a hydrogenated epoxy resin in which an aromatic ring of a bisphenol A type epoxy resin or a cresol novolak type epoxy resin is directly hydrogenated, namely, hydrogen is bonded with the aromatic ring. However, when the aromatic ring is hydrogenated, an unsaturated bond in the epoxy resin decreases and, therefore, light resistance of the hydrogenated epoxy resin is improved, whereas, heat resistance of the hydrogenated epoxy resin deteriorates. Thus, there is proposed a hydrogenated epoxy resin whose heat resistance is improved by mixing the hydrogenated epoxy resin with an acid anhydride, a curing accelerator, and an antioxidant, and optimizing the mixing ratio (see, for example, Patent Document 4).

There has hitherto been made a trial of improving mechanical characteristics of a resin by compositing an inorganic oxide such as silica as a filler with the resin. As the method of compositing the filler with the resin, a method of mixing a dispersion containing an inorganic oxide dispersed in water and/or an organic solvent with a resin is usually used. By mixing the dispersion with the resin using various methods, an inorganic oxide particle composite plastic comprising inorganic oxide particles can be prepared.

In the field of flat panel displays (FPD) such as a liquid crystal display (LCD), a plasma display (PDP), an electroluminescence display (EL), and a surface electric field display (SED), a trial of using various plastic materials in place of a glass substrate, which has conventionally been used, has been made. It becomes possible to solve problems of the glass substrate, such as easiness of breakage, processability, and weight, by using the plastic material.

On the surface of the flat panel display, functional films of various plastic films such as an anti-reflective (AR) film, an anti-glare (AG) film, and a hard coat (HC) film are laminated so as to improve visibility and to prevent a surface flaw. Examples of important characteristics required to such a plastic film include transparency, a refractive index, and mechanical characteristics. When the refractive index is improved, a composite plastic film obtained by compositing a plastic film with an inorganic oxide filler having a high refractive index, for example, zirconia ($ZrO_2$) or titania ($TiO_2$ is used).

The method of compositing the inorganic oxide filler with the plastic is roughly classified into the following methods.
(1) Method of Kneading an Inorganic Oxide Filler into a Plastic Examples of this method include (a) a method of dispersing an inorganic oxide filler in a resin monomer and polymerizing or polycondensing the resin monomer to obtain an inorganic oxide filler-containing plastic film, and (b) a method of dispersing a liquid resin material an inorganic oxide filler, forming into a film and curing a resin material to obtain an inorganic oxide filler-containing plastic film.

As an example of the inorganic oxide filler-containing plastic film, there is proposed a zirconia particle-containing polyester film in which abrasion resistance of the surface is improved by dispersing zirconia particles having a particle diameter of 0.005 to 0.3 μm in a polyester (see, for example, Patent Document 5).
(2) Method of Forming a Film Containing an Inorganic Oxide Filler on a Plastic Film This method is a method of applying a coating material containing an inorganic oxide filler and a binder component on a plastic film and curing the binder component to form a film. As the binder component, an inorganic material such as silica produced by a sol-gel method, and a resin material such as polyester or polyether are used.

As an example of this film, there is proposed a high refractive index/high transparency zirconia particle composite plastic film having a thickness of several microns obtained by compositing zirconia particles having a particle diameter of 10 to 100 nm with a plastic (see, for example, Patent Document 1).

As an optical transparent plastic material, polycarbonate (PC), polymethyl methacrylate (PMMA), and a cyclic olefinic resin have widely been used, heretofore. However, when the transparent plastic material is applied to optical lenses for projectors, optical lenses and substrates for pickups of optical disks, and substrates for flat panel displays (FPD), PC has large fringence, and also PMMA has large water absorptivity and insufficient heat resistance.

A cyclic olefinic resin, which can solve these problems, had such a problem that a flaw may be formed on the surface since it is inferior in scratch resistance.

A method of forming a hard coat layer on the surface is proposed so as to improve scratch resistance of the surface of the optical transparent plastic material, and this method is widely used. A high refractive index hard coat layer is used in prevention of interference fringe of a plastic lens and a hard coat layer and applications such as a hard coat for an anti-reflective film (see, for example, Patent Documents 6 and 7).
(Patent Document 1)
Japanese Unexamined Patent Application, First Publication No. 2005-161111
(Patent Document 2)
Japanese Unexamined Patent Application, First Publication No. 2005-105217
(Patent Document 3)
Japanese Unexamined Patent Application, First Publication No. 2004-292779

(Patent Document 4)
Japanese Unexamined Patent Application, First Publication No. 2005-68234
(Patent Document 5)
Japanese Unexamined Patent Application, First Publication No. Hei 05-171012
(Patent Document 6)
Japanese Unexamined Patent Application, First Publication No. 2004-1393
(Patent Document 7)
Japanese Unexamined Patent Application, First Publication No. Hei 11-302597

DISCLOSURE OF THE INVENTION

When transparency of the substrate using a conventional inorganic oxide particle composite plastic is evaluated, light transmittance of visible light in a light path length, which is a thickness of the substrate, is determined. Therefore, it becomes difficult to maintain transparency in the case of a large thickness.

For example, in the case of the above-described conventional zirconia particle composite plastic film, a high refractive index and high transparency were ensured by controlling the thickness to several μm. Therefore, when the thickness is several tens of μm or more, it becomes difficult to maintain transparency.

As described above, although the zirconia particle composite plastic film is studied, the refractive index and transparency have never been studied when the zirconia particle composite plastic is used as a bulk material.

When conventional inorganic oxide particles are composited with a hydrophobic resin, there may arise such a problem that the inorganic oxide particles and the resin are separated, or transparency is lost as a result of cloudiness, and thus it is difficult to composite with inorganic oxide particles while maintaining transparency of the resin since the surface of the inorganic oxide particles has hydrophilicity.

As a general method for solving such a problem, there is proposed a method of enhancing compatibility of the inorganic oxide particles with the resin by applying a surface modifier such as an organic polymer dispersing agent on the surface of the inorganic oxide particles so as to hydrophobize the surface of the inorganic oxide particles. A composite of the hydrophobized inorganic oxide particles and the resin is excellent in having improved mechanical characteristics and an increased refractive index, but had such a problem that transparency deteriorates and transparency may sometimes be lost since the particle diameter of the inorganic oxide particles is large at 20 nm or more.

The present invention has been made so as to solve the above problems and an object thereof is to provide a transparent inorganic oxide dispersion which makes it possible to improve the refractive index and mechanical characteristics and to maintain transparency by modifying the surface of inorganic oxide particles with a surface modifier having one or more reactive functional groups; an inorganic oxide particle-containing resin composition obtained by compositely integrating the transparent inorganic oxide dispersion with the resin through the polymerization reaction; a composition for sealing a light emitting element; a light emitting element; and a method for producing an inorganic oxide particle-containing resin composition.

A conventional light emitting diode had such a problem that, when light emitted from a light emitting layer is incident upon a silicone resin at an angle smaller than a critical angle, light undergoes total internal reflection upon an interface with the silicone resin since a silicone resin having a refractive index of about 1.4 is used as the sealing resin and therefore a refractive index of the light emitting layer is larger than that of the silicone resin. When total internal reflection arises, light extraction efficiency decreases, and thus luminescent brightness of the light emitting diode decreases.

When the sealing resin has low tenacity, there arose such a problem that cracking occurs when an LED package is mounted to a printed board.

The present invention has been made so as to solve the above problems and an object thereof is to provide a composition for sealing a light emitting element which can maintain transparency suited for use as a sealing material and can improve the refractive index and mechanical characteristics; a light emitting element; and an optical semiconductor device.

The hydrogenated epoxy resin obtained by hydrogenating an aromatic ring of an epoxy resin has improved light resistance but has a decreased refractive index, and there arose such a problem that light extraction efficiency decreases when the hydrogenated epoxy resin is used as a sealing resin of LED.

The present invention has been made so as to solve the above problems and an object thereof is to provide a zirconia-containing epoxy resin composition which is excellent in heat resistance and light resistance and also has a high refractive index; an inorganic oxide particle-containing resin composition containing the same; a light emitting element; and an optical semiconductor device.

In the method of kneading a conventional inorganic oxide filler into a plastic, zirconia particles having a particle diameter of 0.005 to 0.3 μm are composited only by a physical treatment. Therefore, when a thickness of a plastic film is controlled to several tens of μm or more, it is necessary to contain an inorganic oxide filler in the amount enough to obtain a high refractive index so as to ensure a high refractive index of the plastic film. However, there was a problem that when the content of the inorganic oxide filler increases, it becomes difficult to ensure transparency of the plastic film. Also, there was a problem that the content of the inorganic oxide filler needs to be decreased so as to ensure transparency of the plastic film and it becomes difficult to improve the refractive index.

As described above, when the plastic film is allowed to contain an inorganic oxide filler, there is a trade-off relationship between a high refractive index and transparency and thus it was difficult to satisfy both a high refractive index and transparency.

According to the method of forming a film containing an inorganic oxide filler on a plastic film, although a film having a high refractive index can be formed on the surface of the plastic film, it was difficult to completely conform to folding of the plastic film since the high refractive index film is not integrated with a base material. Therefore, there was a problem that, when the plastic film is bent after forming a high refractive index film on the surface of the plastic film, cracking occurs in the high refractive index film or the high refractive index film is peeled off.

The present invention has been made so as to solve the above problems and an object thereof is to provide an inorganic oxide particle-containing transparent plastic member which can realize both a high refractive index and high transparency and also can improve mechanical characteristics; and a composite plastic member.

The material used in a conventional high refractive index hard coat layer includes a composite material containing a high refractive index filler such as zirconia, titania or tin oxide in a resin. However, in a conventional composite material, any of a high refractive index coarse filler having a primary particle diameter of several μm and a high refractive index fine filler having a primary particle diameter of several nm is drastically aggregated and, even when kneaded into a resin, the filler exists in a state of coarse particles having a diameter of several μm and thus the high refractive index filler cannot be uniformly dispersed in the resin. Therefore, there was a problem that it is difficult to further improve light transmittance to visible light, the refractive index and tenacity of the hard coat film.

The present invention has been made so as to solve the above problems and an object thereof is to provide a hard coat film which has high transparency and can improve the refractive index and tenacity; an optical functional film; an optical lens; and an optical component.

The present inventors have intensively studied about a surface modifier of inorganic oxide particles and found that, when the surface of inorganic oxide particles having a disperse particle diameter of 1 nm or more and 20 nm or less is modified with a surface modifier having one or more reactive functional groups and the surface-modified inorganic oxide particles are dispersed in a dispersion to prepare a transparent inorganic oxide dispersion, the refractive index and mechanical characteristics can be improved while maintaining transparency of a composite when inorganic oxide particles and a resin are compositely integrated by the polymerization reaction using the transparent inorganic oxide dispersion. Thus, the present invention has been completed.

Namely, the transparent inorganic oxide dispersion of the present invention comprises inorganic oxide particles which have a surface modified with a surface modifier having one or more reactive functional groups and have a disperse particle diameter of 1 nm or more and 20 nm or less.

The reactive functional group preferably has a carbon-carbon double bond or a silicon-hydrogen bond.

The reactive functional groups are preferably one or more kinds selected from the group consisting of an alkoxyl group, a hydroxyl group, a vinyl group, a styryl group, an acryl group, a methacryl group, an acryloyl group and an epoxy group.

The surface modifiers are preferably one or more kinds selected from the group consisting of an alkoxysilane compound, a chlorosilane compound, an alkylalkoxysilane compound, an alkylchlorosilane compound, a siloxane compound, a surfactant and a titanium coupling agent.

The alkoxysilane compound or chlorosilane compound is preferably a silane coupling agent.

The siloxane compound is preferably a modified silicone or a silicone resin.

The weight ratio of a modified moiety of the surface is preferably 5% by weight or more and 200% by weight or less of the inorganic oxide particles.

The inorganic oxide particles are preferably zirconia particles.

The zirconia particles are preferably tetragonal zirconia particles.

The content of the inorganic oxide particles is preferably 1% by weight or more and 70% by weight or less.

The inorganic oxide particle-containing resin composition (transparent composite) of the present invention comprises inorganic oxide particles obtained from the inorganic oxide transparent dispersion of the present invention, and a resin.

The inorganic oxide particle-containing resin composition of the present invention is characterized in that it is obtained by dispersing the inorganic oxide particles of the present invention in the resin and reacting the inorganic oxide particles with the resin.

The content of the inorganic oxide particles is preferably 1% by weight or more and 80% by weight or less.

The resin is preferably a silicone resin, an epoxy resin, or an acrylic resin.

The epoxy resin is preferably a hydrogenated epoxy resin obtained by hydrogenating an aromatic ring of an aromatic epoxy resin.

The inorganic oxide particles are preferably zirconia particles.

The content of the zirconia particles is preferably 10% by weight or more and 60% by weight or less.

The composition for sealing a light emitting element of the present invention comprises the inorganic oxide particle-containing resin composition of the present invention.

The composition for sealing a light emitting element of the present invention comprises the inorganic oxide particle-containing resin composition (transparent composite) of the present invention.

The refractive index of the inorganic oxide particles is preferably 1.8 or more and the resin is preferably a silicone resin.

Light transmittance of light having a wavelength 350 nm or more and 800 nm or less is preferably 80% or more when the content of zirconia particles is 10% by weight or more and 60% by weight or less.

The light emitting element of the present invention is characterized in that at least a light transmitting region is made of the inorganic oxide particle-containing resin composition of the present invention.

In the light emitting element, at least a light transmitting region is preferably sealed with the composition for sealing a light emitting element of the present invention.

The method for producing an inorganic oxide particle-containing resin composition of the present invention comprises mixing the transparent inorganic oxide dispersion of the present invention with a resin, molding or filling the resulting mixture, and curing the resulting molded article or filling material.

The present inventors have intensively studied about nanometer-sized tetragonal zirconia particles which is predominant in view of an improvement in mechanical characteristics since a tenacity enhancing mechanism called martensitic transformation exists when composited as a second phase and found that, when the surface of tetragonal zirconia particles having a disperse particle diameter of 1 nm or more and 20 nm or less are modified with a surface modifier and the surface-modified tetragonal zirconia particles are dispersed in a dispersion to prepare an inorganic oxide transparent dispersion, the refractive index and mechanical characteristics can be improved while maintaining transparency of the composite when composited with the resin. Thus, the present invention has been made.

Namely, the transparent inorganic oxide dispersion of the present invention comprises tetragonal zirconia particles which have a surface modified with a surface modifier and have a disperse particle diameter of 1 nm or more and 20 nm or less.

The surface modifiers are preferably one or more kinds selected from the group consisting of an alkoxysilane compound, a siloxane compound, a surfactant and a titanium coupling agent.

The alkoxysilane compound is preferably a silane coupling agent.

The siloxane compound is preferably a modified silicone.

The weight ratio of a modified moiety of the surface is preferably 5% by weight or more and 200% by weight or less of the inorganic oxide particles.

The content of the tetragonal zirconia particles is preferably 1% by weight or more and 70% by weight or less.

The inorganic oxide particle-containing resin composition of the present invention comprises tetragonal zirconia particles is characterized in that it is obtained by dispersing tetragonal zirconia particles, which have a surface modified with a surface modifier and have a disperse particle diameter of 1 nm or more and 20 nm or less, in a resin.

The resin is preferably a silicone resin, an epoxy resin, or an acrylic resin.

The content of the tetragonal zirconia particles is preferably 1% by weight or more and 80% by weight or less.

The method for producing an inorganic oxide particle-containing resin composition of the present invention comprises mixing the transparent inorganic oxide dispersion of the present invention with a resin, molding or filling the resulting mixture, and curing the resulting molded article or filling material.

The present inventors have taken notice of inorganic oxide particles having a refractive index of 1.8 or more as an inorganic filler and intensively studied so as to overcome such disadvantages that any of a high refractive index coarse filler having a primary particle diameter of several μm and a high refractive index fine filler having a primary particle diameter of several nm is drastically aggregated and, even when kneaded, exist as course particles of several μm in a resin, and thus transparency of the sealing material is lost. As a result, the present inventors have found that, when the light transmitting region of a light emitting element is sealed with a composition for sealing a light emitting element comprising inorganic oxide particles having a disperse particle diameter of 1 nm or more and 20 nm or less, and a refractive index of 1.8 or more, and a silicone resin, light extraction efficiency of the light emitting element can be improved while maintaining a high light transmittance, a high refractive index, a high thermostability, a high hardness and weatherability. Thus, the present invention has been made.

The composition for sealing a light emitting element of the present invention comprises inorganic oxide particles having a disperse particle diameter of 1 nm or more and 20 nm or less and a refractive index of 1.8 or more, and a silicone resin.

The inorganic oxide particles are preferably zirconia particles.

The content of the inorganic oxide particles is preferably 1% by weight or more and 80% by weight or less.

The light emitting element of the present invention is characterized in that it is obtained by sealing at least a light transmitting region with the composition for sealing a light emitting element of the present invention.

The optical semiconductor device of the present invention comprises the light emitting element of the present invention.

The present inventors have intensively studied so as to solve the above problems and found that a refractive index can be improved while maintaining heat resistance and light resistance of an epoxy resin by adding zirconia particles, which have a surface modified with a surface modifier and have a disperse particle diameter of 1 nm or more and 20 nm or less, to a hydrogenated epoxy resin. Thus, the present invention has been completed.

Namely, the inorganic oxide particle-containing resin composition of the present invention comprises tetragonal zirconia particles which have a surface modified with a surface modifier and have a disperse particle diameter of 1 nm or more and 20 nm or less, and a hydrogenated epoxy resin obtained by hydrogenating an aromatic ring.

In the inorganic oxide particle-containing resin composition of the present invention, the surface modifier is preferably a siloxane compound and/or a surfactant.

In the inorganic oxide particle-containing resin composition of the present invention, the content of the zirconia particles is preferably 10% by weight or more and 60% by weight or less.

The composition for sealing a light emitting element (transparent composite) of the present invention comprises the inorganic oxide particle-containing resin composition (zirconia-containing epoxy resin composition) of the present invention.

In the composition for sealing a light emitting element (transparent composite) of the present invention, a light transmittance of light having a wavelength of 350 nm or more and 800 nm or less is preferably 80% or more when the content of zirconia particles is 10% by weight or more and 60% by weight or less.

The light emitting element of the present invention is characterized in that it is obtained by sealing at least a light transmitting region with the composition for sealing a light emitting element (transparent composite) of the present invention.

The optical semiconductor device of the present invention comprises the light emitting element of the present invention.

The present inventors have intensively studied so as to solve the above problems and found that dispersibility and a high filling rate of fine zirconia particles in a plastic can be realized by modifying the surface of fine zirconia particles having a disperse particle diameter of 1 nm or more and 20 nm or less with a surface modifier and uniformly dispersing the surface-modified fine zirconia particles in a film- or sheet-like transparent plastic, thus making it possible to ensure a high refractive index while maintaining high transparency and to improve mechanical characteristics. Thus, the present invention has been completed.

Namely, the inorganic oxide particle-containing transparent plastic member (fine zirconia transparent plastic member) of the present invention comprises inorganic oxide particles obtained from the transparent inorganic oxide dispersion.

The inorganic oxide particle-containing transparent plastic member of the present invention is preferably a film- or sheet-like transparent plastic member comprising fine zirconia particles which have a surface modified with a surface modifier and have a disperse particle diameter of 1 nm or more and 20 nm or less.

The content of the fine zirconia particles is preferably 10% by weight or more and 80% by weight or less.

In the inorganic oxide particle-containing transparent plastic member, visible light transmittance is preferably 80% or more when the thickness is 30 μm or more and 300 μm or less.

The surface modifiers are preferably one or more kinds selected from the group consisting of an alkoxysilane, chlorosilane, an alkylalkoxysilane, an alkylchlorosilane, siloxane, and a surfactant.

The alkoxysilane or chlorosilane is preferably a silane coupling agent.

The siloxane is preferably a modified silicone or a silicone resin.

The composite plastic member of the present invention comprises the inorganic oxide particle-containing transparent plastic member of the present invention.

The present inventors have taken notice of the fact that, when zirconia particles as an inorganic filler, particularly tetragonal zirconia is added as a second phase of a composite material, the composite material shows high tenacity through volume expansion called martensitic transformation and intensively studied so as to overcome such disadvantages that any of a high refractive index coarse filler having a primary particle diameter of several μm and a high refractive index fine filler having a primary particle diameter of several nm is drastically aggregated and, even when kneaded, exist as course particles of several μm in a resin, and thus transparency of the sealing material is lost. As a result, the present inventors have found that, when tetragonal zirconia particles having a disperse particle diameter of 1 nm or more and 20 nm or less are used as zirconia particles to form a hard coat film containing the tetragonal zirconia particles, a high light transmittance, a high refractive index, a high thermostability, a high hardness and weatherability are satisfied. Thus, the present invention has been completed.

Namely, the hard coat film of the present invention comprises inorganic oxide particles obtained from the transparent inorganic oxide dispersion of the present invention.

The hard coat film of the present invention preferably comprises tetragonal zirconia particles having a disperse particle diameter of 1 nm or more and 20 nm or less. The tetragonal zirconia particles are preferably dispersed in a hard coat base material.

The content of the tetragonal zirconia particles is preferably 1% by weight or more and 80% by weight or less.

The optical functional film of the present invention comprises at least the hard coat film of the present invention in a light transmitting region.

The optical lens of the present invention comprises at least the hard coat film of the present invention in a light transmitting region.

The optical component of the present invention comprises the optical lens of the present invention.

The transparent inorganic oxide dispersion of the present invention contains inorganic oxide particles which have a surface modified with a surface modifier having one or more reactive functional groups and have a disperse particle diameter of 1 nm or more and 20 nm or less, and thus the refractive index and mechanical characteristics can be further enhanced and transparency can be maintained.

Therefore, when this transparent inorganic oxide dispersion is mixed with a resin, an inorganic oxide particle-containing resin composition (transparent composite) having a high refractive index, excellent transparency and improved mechanical characteristics can be easily obtained.

According to the inorganic oxide particle-containing resin composition (transparent composite) of the present invention, the inorganic oxide particles of the present invention are dispersed in a resin and reacted with the resin, and thus the refractive index and mechanical characteristics can be further enhanced and also transparency can be maintained.

According to the method for producing an inorganic oxide particle-containing resin composition (transparent composite) of the present invention, the transparent inorganic oxide dispersion of the present invention is mixed with a resin and the resulting mixture is molded or filled, and then the resulting molded article or filling material is cured, and thus it is possible to easily produce an inorganic oxide particle-containing resin composition (transparent composite) having an excellent refractive index and excellent mechanical characteristics without deteriorating transparency at low cost.

The transparent inorganic oxide dispersion of the present invention contains tetragonal zirconia particles which have a surface modified with a surface modifier and have a disperse particle diameter of 1 nm or more and 20 nm or less, and thus it is possible to improve the refractive index and mechanical characteristics and to maintain transparency.

Therefore, when this transparent inorganic oxide dispersion is mixed with a resin, it is possible to easily obtain an inorganic oxide particle-containing resin composition (transparent composite) which has a high refractive index and is excellent in transparency, and also has improved mechanical characteristics.

According to the inorganic oxide particle-containing resin composition (transparent composite) of the present invention, tetragonal zirconia particles, which have a surface treated with a surface modifier and have a disperse particle diameter of 1 nm or more and 20 nm or less, are dispersed in a resin, and thus the refractive index, transparency and mechanical characteristics can be enhanced.

According to the method for producing an inorganic oxide particle-containing resin composition (transparent composite) of the present invention, the transparent inorganic oxide dispersion of the present invention is mixed with a resin and the resulting mixture is molded or filled, and then the resulting molded article or filling material is cured, and thus it is possible to easily produce an inorganic oxide particle-containing resin composition (transparent composite) which has a high refractive index and excellent mechanical characteristics, and also has improved mechanical characteristics.

The composition for sealing a light emitting element of the present invention contains inorganic oxide particles having a disperse particle diameter of 1 nm or more and 20 nm or less and a refractive index of 1.8 or more, and a silicone resin, and thus transparency can be maintained and the refractive index and mechanical characteristics can be improved.

According to the light emitting element of the present invention, at least a light transmitting region is sealed with the composition for sealing a light emitting element of the present invention, and thus transparency of the light transmitting region can be maintained and the refractive index, thermostability, hardness and weatherability can be improved.

Therefore, light extraction efficiency can be improved and high luminescent brightness can be obtained, and also reliability can be improved for a long period.

The optical semiconductor device of the present invention comprises the light emitting element of the present invention, and thus performances of the device can be improved and reliability of the device can be improved for a long period.

The inorganic oxide particle-containing resin composition of the present invention comprises tetragonal zirconia particles which have a surface modified with a surface modifier and have a disperse particle diameter of 1 nm or more and 20 nm or less, and a hydrogenated epoxy resin obtained by hydrogenating an aromatic ring, and thus it is possible to prepare a composition for sealing a light emitting element (transparent composite) which is excellent in heat resistance and light resistance and has an improved refractive index while maintaining transparency.

According to the light emitting element of the present invention, at least a light transmitting region is sealed with the composition for sealing a light emitting element (transparent composite) of the present invention, and thus transparency of the light transmitting region can be maintained, and the refractive index, thermostability, hardness and weatherability can be improved.

Therefore, light extraction efficiency can be improved and high luminescent brightness can be obtained, and also reliability can be improved for a long period.

The optical semiconductor device of the present invention comprises the light emitting element of the present invention, and thus performances of the device can be improved and reliability of the device can be improved for a long period.

The inorganic oxide particle-containing transparent plastic member of the present invention is a film- or sheet-like transparent plastic member comprising fine zirconia particles which have a surface modified with a surface modifier and have a disperse particle diameter of 1 nm or more and 20 nm or less, and thus a high refractive index can be ensured while maintaining transparency of a plastic member and also mechanical characteristics can be improved.

Therefore, a plastic member having a high refractive index, high transparency and improved mechanical characteristics can be provided.

The composite plastic member of the present invention comprises the inorganic oxide particle-containing transparent plastic member of the present invention, and thus a high refractive index can be ensured while maintaining transparency of a composite plastic member and also mechanical characteristics can be improved.

The hard coat film of the present invention contains tetragonal zirconia particles having a disperse particle diameter of 1 nm or more and 20 nm or less, and thus transparency can be maintained and also a refractive index and tenacity can be improved.

The optical functional film of the present invention comprises at least the hard coat film of the present invention in a light transmitting region, and thus transparency of the light transmitting region can be maintained and also the refractive index, thermostability, hardness and weatherability can be improved. Thus, reliability can be improved for a long period.

The optical lens of the present invention comprises at least the hard coat film of the present invention in a light transmitting region, and thus transparency of the light transmitting region can be maintained and also a refractive index, thermostability, hardness and weatherability can be improved. Thus, reliability can be improved for a long period.

The optical component of the present invention comprises the optical lens of the present invention, and thus performances suited for use as a component can be improved and reliability of an optical component can be improved for a long period.

DESCRIPTION OF REFERENCE NUMERALS

Figure 1:
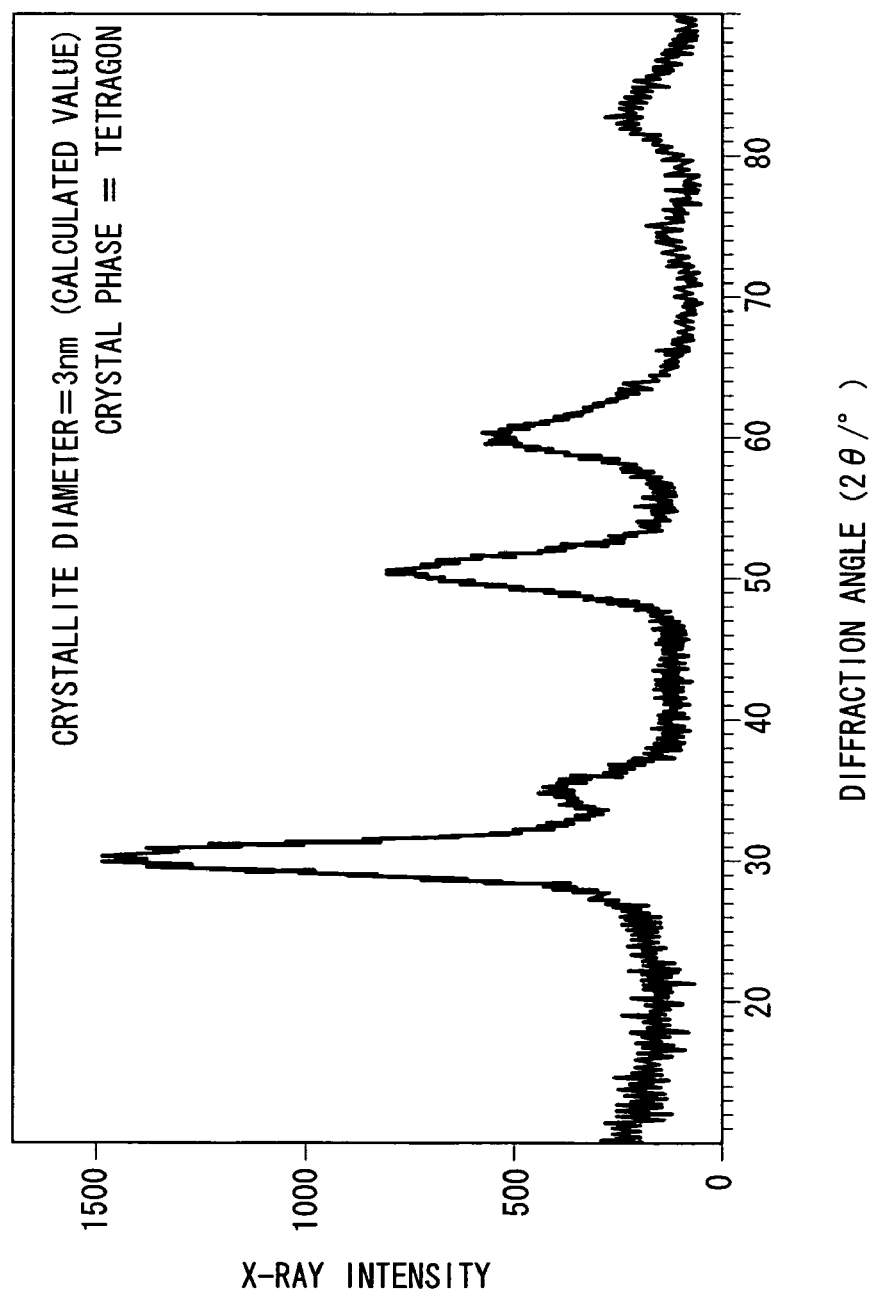
FIG. 1 is a graph showing a powder X-ray diffraction pattern of zirconia particles according to Example 6 of the present invention.

1 LED chip
2 Lead frame
3 External terminal
4 Sealing material
5 Metal case
6 Insulating material
7 Aperture portion
8 Transparent base material
9 Convex lens portion
10 Hard coat film

BEST MODE FOR CARRYING OUT THE INVENTION

The best mode for carrying out the transparent inorganic oxide dispersion, the inorganic oxide particle-containing resin composition, the composition for sealing a light emitting element, the light emitting element and the method for producing an inorganic oxide particle-containing resin composition of the present invention will be described below.

This mode is described in detail for purposes of clarity of understanding of the purport of the invention, and the present invention is not to be limited thereto unless otherwise specified.

(Transparent Inorganic Oxide Dispersion)

The transparent inorganic oxide dispersion of the present invention is a dispersion comprising inorganic oxide particles which have a surface modified with a surface modifier having one or more reactive functional groups and have a disperse particle diameter of 1 nm or more and 20 nm or less, and a disperse medium.

Examples of the inorganic oxide include, but are not limited to, zirconium oxide ($ZrO_2$), titanium oxide ($TiO_2$), silicon oxide ($SiO_2$), aluminum oxide ($Al_2O_3$), iron oxide ($Fe_2O_3$, FeO, $Fe_3O_4$), copper oxide (CuO, $Cu_2O$), zinc oxide (ZnO), yttrium oxide ($Y_2O_3$), niobium oxide ($Nb_2O_5$), molybdenum oxide ($MoO_3$), indium oxide ($In_2O_3$, $In_2O$), tin oxide ($SnO_2$), tantalum oxide ($Ta_2O_5$), tungsten oxide ($WO_3$, $W_2O_5$), lead oxide (PbO, $PbO_2$), bismuth oxide ($Bi_2O_3$), cerium oxide ($CeO_2$, $Ce_2O_3$), antimony oxide ($Sb_2O_3$, $Sb_2O_5$), germanium oxide ($GeO_2$, GeO), lanthanum oxide ($La_2O_3$), and ruthenium oxide ($RuO_2$).

The inorganic oxide also includes complex oxides obtained by compositing plural kinds of these inorganic oxides, for example, tin-added indium oxide (ITO), antimony-added tin oxide (ATO), and zinc aluminum oxide ($ZnO.Al_2O_3$).

It is necessary that the surface modifier has one or more reactive functional groups, and this reactive functional group preferably has a carbon-carbon double bond or a silicon-hydrogen bond.

The reactive functional groups are preferably one or more kinds selected from the group consisting of an alkoxyl group, a hydroxyl group, a vinyl group, a styryl group, an acryl group, a methacryl group, an acryloyl group, and an epoxy group.

Of these surface modifiers, one or more kinds selected from the group consisting of an alkoxysilane compound, a siloxane compound, a titanium coupling agent, and a surfactant are particularly preferred among those having a carbon-carbon double bond or a silicon-hydrogen bond.

Of these surface modifiers, a silane coupling agent is particularly preferred as an alkoxysilane compound and a modified silicone or silicone resin is particularly preferred as a siloxane compound.

Examples of the silane coupling agent include vinyltrimethoxysilane, vinyltriethoxysilane, vinyltrichlorosilane, vinyltriphenoxysilane, 3-glycidoxypropyltrimethoxysilane, 3-glycidoxypropyltriethoxysilane, 3-glycidoxypropyltrichlorosilane, 3-glycidoxypropyltriphenoxysilane, p-styryltrimethoxysilane, p-styryltriethoxysilane, p-styryltrichlorosilane, p-styryltriphenoxysilane, 3-acryloxypropyltmmethoxysilane, 3-acryloxypropyltriethoxysilane, 3-acryloxypropyltrichlorosilane, 3-acryloxypropyltriphenoxysilane, 3-methacryloxypropyltrimethoxysilane, 3-methacryloxypropyltriethoxysilane, 3-methacryloxypropyltrichlorosilane, 3-methacryloxypropyltriphenoxysilane, allyltrimethoxysilane, allyltriethoxysilane, allyltrichlorosilane, and allyltriphenoxysilane.

The silane coupling agent also includes vinylethyldimethoxysilane, vinylethyldiethoxysilane, vinylethyldichlorosilane, vinylethyldiphenoxysilane, 3-glycidoxypropylethyldimethoxysilane, 3-glycidoxypropyltriethyldiethoxysilane, 3-glycidoxypropylethyldichlorosilane, 3-glycidoxypropylethyldiphenoxysilane, p-styrylethyldimethoxysilane, p-styrylethyldiethoxysilane, p-styryltriethyldichlorosilane, p-styrylethyldiphenoxysilane, 3-acryloxypropylethyldimethoxysilane, 3-acryloxypropylethyldiethoxysilane, 3-acryloxypropylethyldichlorosilane, 3-acryloxypropylethyldiphenoxysilane, 3-methacryloxypropylethyldimethoxysilane, 3-methacryloxypropylethyldiethoxysilane, 3-methacryloxypropylethyldichlorosilane, 3-methacryloxypropylethyldiphenoxysilane, allylethyldimethoxysilane, allylethyldiethoxysilane, allylethyldichlorosilane, and allylethyldiphenoxysilane.

The silane coupling agent further includes vinyldiethylmethoxysilane, vinyldiethylethoxysilane, vinyldiethylchlorosilane, vinyldiethylphenoxysilane, 3-glycidoxypropyldiethylmethoxysilane, 3-glycidoxypropyldiethylethoxysilane, 3-glycidoxypropyldiethylchlorosilane, 3-glycidoxypropyldiethylphenoxysilane, p-styryldiethylmethoxysilane, p-styryldiethylethoxysilane, p-styryldiethylchlorosilane, p-styryldiethylphenoxysilane, 3-acryloxypropyldiethylmethoxysilane, 3-acryloxypropyldiethylethoxysilane, 3-acryloxypropyldiethylchlorosilane, 3-acryloxypropyldiethylphenoxysilane, 3-methacryloxypropyldiethylmethoxysilane, 3-methacryloxypropyldiethylethoxysilane, 3-methacryloxypropyldiethylchlorosilane, 3-methacryloxypropyldiethylphenoxysilane, allyldiethylmethoxysilane, allyldiethylethoxysilane, allyldiethylchlorosilane, and allyldiethylphenoxysilane.

Examples of the modified silicone include epoxy modified silicone, epoxy polyether-modified silicone, methacryl modified silicone, phenol modified silicone, methylstyryl modified silicone, acryl modified silicone, alkoxy-modified silicone, and methylhydrodienesilicone.

It is particularly preferred to use a modified silicon having a functional group bonded to a vinyl group and/or a silicon atom since the functional group bonded to the vinyl group and/or the silicon atom contributes to the chemical reaction when the resin is cured.

Examples of the silicone resin include a methylsilicone resin, a methylphenylsilicone resin, and a diphenylsilicone resin.

As the surfactant, ionic surfactants such as anionic surfactants, cationic surfactants, and amphoteric surfactants, or nonionic surfactants are preferably used.

Examples of the anionic surfactant include sodium fatty acids such as sodium oleate, sodium stearate, and sodium laurate; fatty acid-based surfactants such as potassium fatty acid and sodium fatty acid ester sulfonate; phosphoric acid-based surfactants such as sodium alkyl sulfonate; olefinic surfactants such as sodium alpha-olefin sulfonate; and alcohol- and alkylbenzene-based surfactants such as sodium alkyl sulfate.

Examples of the cationic surfactant include alkylmethylamunonium chloride, alkyldimethylammonium chloride, alkyltrimethylammonium chloride, and alkyldimethylbenzylammonium chloride.

Examples of the amphoteric surfactant include carboxylic acid-based surfactants such as alkyl aminocarboxylate; and phosphate-based surfactants such as phosphobetain.

Examples of the nonionic surfactant include fatty acid-based surfactants such as acrylic acid, crotonic acid, oleic acid, linoleic acid, linolenic acid, polyoxyethylene lanolin fatty acid ester, and polyoxyethylene sorbitan fatty acid ester; and unsaturated fatty acids such as polyoxyethylene alkyl phenyl ether and fatty acid alkanolamide.

Examples of the titanium coupling agent include isopropyltriisostearoyl titanate, isopropyldimethacrylisostearoyl titanate, isopropyltri(dodecyl)benzenesulfonyl titanate, neopentyl(diallyl)oxy-tri(dioctyl)phosphate titanate, and neopentyl(diallyl)oxy-trineododecanoyl titanate.

Examples of the method of modifying the surface of inorganic oxide particles with the above surface modifier include a wet method and a dry method.

The wet method is a method of modifying the surface of inorganic oxide particles by charging a surface modifier and inorganic oxide particles in a solvent, followed by mixing.

The dry method is a method of modifying the surface of inorganic oxide particles by charging a surface modifier and dried inorganic oxide particles in a dry mixer such as a mixer, followed by mixing.

The weight ratio of the modified moiety of inorganic oxide particles whose surface are modified is preferably 5% by weight or more and 200% by weight or less, more preferably 10% by weight or more and 100% by weight or less, and still more preferably 20% by weight or more and 100% by weight or less, based on the total amount of inorganic oxide particles.

The weight ratio of the modified moiety is limited to 5% by weight or more and 200% by weight or less for the following reasons. When the weight ratio of the modified moiety is less than 5% by weight, it becomes difficult to compatibilize the inorganic oxide particles with the resin and transparency is lost in the case of compositing with the resin. In contrast, when the weight ratio of the modified moiety is more than 200% by weight, the surface treating agent exerts a large influence on resin characteristics and composite characteristics such as refractive index deteriorate.

The disperse particle diameter of inorganic oxide particles is limited to 1 nm or more and 20 nm or less for the following reasons. When the disperse particle diameter is less than 1 nm, crystallinity deteriorates and it becomes difficult to exhibit particle characteristics such as refractive index. In contrast, when the disperse particle diameter is more than 20 nm, transparency deteriorates when formed into a dispersion or an inorganic oxide particle-containing resin composition.

As described above, inorganic oxide particles are nanometer-sized particles, and thus less light scattering occurs and transparency of the composite can be maintained even when the inorganic oxide particles are dispersed in a resin to prepare an inorganic oxide particle-containing resin composition.

The zirconia particles were limited to tetragonal zirconia particles for the following reasons. In view of synthesis of fine particles, when the particle diameter of fine particles become as small as 20 nm or less, a tetragon becomes more stable than a conventionally known monocline and has high hardness, and also mechanical characteristics of the inorganic oxide particle-containing resin composition can be improved. When formed into an inorganic oxide particle-containing resin composition containing zirconia particles in a resin, by adding tetragonal zirconia as a second phase of the inorganic oxide particle-containing resin composition, it shows high tenacity through volume expansion called martensitic transformation as compared with the case of adding monoclinic zirconia particles.

The disperse particle diameter of tetragonal zirconia particles is limited to 1 nm or more and 20 nm or less for the following reasons. When the disperse particle diameter is less than 1 nm, crystallinity deteriorates and it becomes difficult to exhibit particle characteristics such as refractive index. In contrast, when the disperse particle diameter is more than 20 nm, transparency deteriorates when formed into a dispersion or an inorganic oxide particle-containing resin composition.

As described above, less light scattering occurs and transparency of the composite can be maintained even when the tetragonal zirconia particles are dispersed in a resin to prepare an inorganic oxide particle-containing resin composition since the tetragonal zirconia particles are nanometer-sized particles.

The content of the inorganic oxide particles is preferably 1% by weight or more and 70% by weight or less, more preferably 1% by weight or more and 50% by weight or less, and still more preferably 5% by weight or more and 30% by weight or less.

The content of the inorganic oxide particles is limited to 1% by weight or more and 70% by weight or less for the following reasons. This range is a range which enables good dispersion state of the inorganic oxide particles. When the content is less than 1% by weight, the effect of the inorganic oxide particles decreases. In contrast, when the content is more than 70% by weight, gelation and aggregation/precipitation occur and a feature as the dispersion disappears.

The disperse medium basically contains at least one kind of water, an organic solvent, a liquid resin monomer, and a liquid resin oligomer.

It is possible to preferably use, as the organic solvent, alcohols such as methanol, ethanol, 2-propanol, butanol, and octanol; esters such as ethyl acetate, butyl acetate, ethyl lactate, propylene glycol monomethyl ether acetate, propylene glycol monoethyl ether acetate, and γ-butyrolactone; ethers such as diethylether, ethylene glycol monomethyl ether (methyl cellosolve), ethylene glycol monoethyl ether (ethyl cellosolve), ethylene glycol monobutyl ether (butyl cellosolve), diethylene glycol monomethyl ether, and diethylene glycol monoethyl ether; ketones such as acetone, methyl ethyl ketone, methyl isobutyl ketone, acetylacetone, and cyclohexanone; aromatic hydrocarbons such as benzene, toluene, xylene, and ethylbenzene; and amides such as dimethylformamide, N,N-dimethylacetoacetamide, and N-methylpyrrolidone. One or more kinds of these solvents can be used.

As the liquid resin monomer, an acrylic or methacryl-based monomer such as methyl acrylate or methyl methacrylate, and an epoxy-based monomer are preferably used.

As the liquid resin oligomer, a urethane acrylate-based oligomer, an epoxy acrylate-based oligomer, and an acrylate-based oligomer are preferably used.

The transparent inorganic oxide dispersion may also contain a resin monomer as long as the characteristics are not impaired.

The visible light transmittance of the transparent inorganic oxide dispersion varies depending on the composition and the content of the inorganic oxide. When the content of the inorganic oxide is 5% by weight and the light path length is 10 mm, the visible light transmittance is preferably 90% or more, and more preferably 95% or more.

For example, when zirconia particles are used as the inorganic oxide particles and the light path length is 10 mm, the visible light transmittance is 95% or more when the content of the zirconia particles is 1% by weight, and is 80% or more when the content of the zirconia particles is 40% by weight.

Inorganic Oxide Particle-Containing Resin Composition (Transparent Composite)

The inorganic oxide particle-containing resin composition of the present invention is a composite obtained by dispersing organic oxide particles, which have a surface modified with a surface modifier having one or more reactive functional groups and have a disperse particle diameter of 1 nm or more and 20 nm or less, in a resin and reacting with the resin.

The resin may be a resin which has transparency to light having a predetermined wavelength region, such as visible light or near infrared light, and it is possible to preferably use curable resins having thermoplasticity, thermocurability, light (electromagnetic wave) curability through visible light, ultraviolet light or infrared light, and electron curability through irradiation with an electron.

Examples of the resin include an acrylate such as polymethyl methacrylate (PMMA) or polycyclohexyl methacrylate, polycarbonate (PC), polystyrene (PS), polyether, polyester, polyallylate, polyacrylate ester, polyamide, phenolformaldehyde (phenol resin), diethylene glycol bisallyl carbonate, acrylonitrile-styrene copolymer (AS resin), methyl methacrylate-styrene copolymer (MS resin), poly-4-methylpentene, norbornene-based polymer, polyurethane, epoxy, and silicone. Of these resins, silicone, epoxy and an acrylate are particularly preferred.

The silicone resin is preferably composed of at least the following components (a) to (c):

(a) organopolysiloxane in which at least one group of functional groups combined with a silicon atom in a molecule is an alkenyl group, (b) linear organopolysiloxane in which at least two groups of functional groups combined with a silicon atom in a molecule is a hydrogen atom, or both ends of a molecular chain is blocked with a hydrogen atom, and (c) a catalyst for a hydrosilylation reaction.

Examples of the alkenyl group in the component (a) include a vinyl group, an allyl group, a pentenyl group, and a hexenyl group. Of these groups, a vinyl group is particularly preferred.

Examples of the functional group combined with a silicon atom other than the alkenyl group include an alkyl group such as a methyl group, an ethyl group, a propyl group, or a butyl group; an aryl group such as a phenyl group or a tolyl group; and an aralkyl group such as a benzyl group or a phenethyl group. Of these groups, a methyl group is particularly preferred.

Examples of the functional group combined with a silicon atom other than the hydrogen atom in the component (b) include an alkyl group such as a methyl group, an ethyl group, a propyl group, or a butyl group; an aryl group such as a phenyl group or a tolyl group; and an aralkyl group such as a benzyl group or a phenethyl group. Of these groups, a methyl group is particularly preferred.

The content of the component (b) is within a range from 0.1 to 10 mol, more preferably from 0.1 to 5 mol, and more preferably from 0.5 to 2 mol, in terms of a hydrogen atom based on 1 mol of the total alkenyl groups contained in the component (a).

The catalyst for hydrosilylation reaction of the component (c) is a catalyst for promoting the hydrosilylation reaction between the alkenyl group in the component (a) and the hydrogen atom combined with the silicon atom in the component (b). Examples of the catalyst include a platinum-based catalyst, a rhodium-based catalyst, and a palladium-based catalyst. Of these catalysts, a platinum-based catalyst is particularly preferred.

Examples of the platinum-based catalyst include a fine platinum powder, chloroplatinic acid, a platinum-olefin complex, and a platinum carbonyl complex. Of these catalysts, chloroplatinic acid is particularly preferred.

The content of the component (c) may be an amount which enables promotion of curing of the present composition, namely, an amount which enables promotion of the hydrosilylation reaction between the alkenyl group in the component (a) and the hydrogen atom combined with the silicon atom in the component (b), and is not specifically limited. Specifically, the content of the metal atom in the present component is within a range from 0.01 to 500 ppm by weight, and more preferably 0.01 to 50 ppm by weight, based on the present composition.

The content of the metal atom in the present component is limited to the above range for the following reasons. When the content is less than 0.01 ppm, the present composition may not be sufficiently cured. In contrast, when the content is more than 500 ppm, the resulting cured article causes a problem such as coloration.

This silicone resin may contain heat-resistance improvers, dyes, pigments, and flame retardants as optional components as long as the objects of the present invention are not adversely affected.

It is possible to preferably use, as the epoxy resin, a difunctional glycidyl ether type epoxy resin such as a bisphenol A type epoxy resin, a bisphenol F type epoxy resin, a bisphenol S type epoxy resin, a hydrogenated bisphenol A type epoxy resin, or a biphenyl type epoxy resin; a polyfunctional glycidyl ether type epoxy resin such as a phenol novolak type epoxy resin, an orthocresol novolak type epoxy resin, an alkyl modified triphenolmethane type epoxy resin, a trishydroxyphenylmethane type epoxy resin, or a tetraphenylolethane type epoxy resin; and a glycidylamine type epoxy resin such as a tetraglycidyl diaminodiphenylmethane type epoxy resin, a triglycidyl isocyanurate type epoxy resin, an aminophenol type epoxy resin, an aniline type epoxy resin, or a toluidine type epoxy resin.

As the curing agent of the epoxy resin, any of a polyaddition type, catalyst type, and a condensation type curing agent can be used. Examples thereof include diaminodiphenylmethane, diaminodiphenylsulfone, polyamide, dicyandiamide, diethylenetriamine, triethylenetetramine, hexahydrophthalic anhydride, and methyltetrahydrophthalic anhydride.

As the acrylic resin, a monofunctional acrylate and/or a polyfunctional acrylate are used, and one or more kinds of them can be used.

Specific examples of the monofunctional acrylate and the polyfunctional acrylate include the following.

(a) Examples of the aliphatic monofunctional (meth)acrylate include an alkyl (meth)acrylate such as butyl(meth)acrylate, lauryl(meth)acrylate, or stearyl (meth)acrylate; an alkoxyalkylene glycol (meth)acrylate such as methoxypropylene glycol (meth)acrylate or ethoxydiethylene glycol (meth)acrylate; and an N-substituted acrylamide such as (meth)acrylamide or N-butoxymethyl(meth)acrylamide.

(b) Examples of the aliphatic polyfunctional (meth)acrylate include an alkylene glycol di(meth)acrylate such as 1,6-hexanediol di(meth)acrylate, 1,4-butanediol di(meth)acrylate, ethylene glycol di(meth)acrylate, diethylene glycol di(meth)acrylate, triethylene glycol di(meth)acrylate, tetraethylene glycol di(meth)acrylate, tripropylene glycol di(meth)acrylate, neopentyl glycol di(meth)acrylate, polyethylene glycol di(meth)acrylate, or polybutanediol di(meth)acrylate; a tri(meth)acrylate such as pentaerythritol triacrylate, trimethylolpropane tri(meth)acrylate, ethylene oxide, or propylene oxide-modified trimethylolpropane triacrylate; a tetra(meth)acrylate such as pentaerythritol tetraacrylate or di-trimethylolpropane tetraacrylate; and a penta(meth)acrylate such as dipentaerythritol (monohydroxy)pentaacrylate.

(c) Among the alicyclic (meth)acrylate, a monofunctional type includes cyclohexyl(meth)acrylate and a polyfunctional type includes dicyclopentadienyl di(meth)acrylate.

(d) Among the aromatic (meth)acrylate, a monofunctional type includes phenyl (meth)acrylate, benzyl(meth)acrylate, phenoxyethyl(meth)acrylate, and phenoxydiethylene glycol (meth)acrylate, and a polyfunctional type includes diacrylates such as bisphenol A di(meth)acrylate, and bisphenol F di(meth)acrylate.

(e) Examples of the polyurethane (meth)acrylate include polyurethane ether (meth)acrylate and polyester (meth)acrylate.

(f) Examples of the epoxy(meth)acrylate include bisphenol A type epoxy acrylate and novolak type epoxy acrylate.

Examples of the radical polymerization initiator include a peroxide-based polymerization initiator such as lauroyl peroxide, benzoyl peroxide, di-t-butyl peroxide, t-butyl-peroxy-2-ethyl hexanoate, t-butyl-peroxy isobutylate, t-butyl-peroxy pivalate, t-butyl-peroxy benzoate, or t-butyl-peroxy acetate, or an azo-based polymerization initiator such as 2,2'-azobisisobutyronitrile.

The form of the reaction between the inorganic oxide particles and the resin is preferably the polymerization reaction between a reactive functional group remaining on the surface of inorganic oxide particles and the resin since the refractive index and mechanical characteristics can be further enhanced and transparency can be maintained.

In the case of a silicone resin, the polymerization reaction is an addition polymerization reaction or a condensation polymerization reaction. In the case of an epoxy resin or an acrylic resin, it is an addition polymerization reaction.

The reaction form is shown in Table 1.

TABLE 1

| Resin | Polymerization reaction | Reactive functional group side | Resin side |
|---|---|---|---|
| Silicone resin | Addition polymerization reaction | Silicon-hydrogen bond, Carbon-carbon double bond | Carbon-carbon double bond, Silicon-hydrogen bond |
| | Condensation polymerization reaction | Silanol group, Alkoxyl group, Alkyl group-substituted amino group, Silicon-hydrogen bond | Silanol group, Alkoxyl group, Alkyl group-substituted amino group, Silicon-hydrogen bond |
| Acrylic resin | Addition polymerization reaction | Vinyl group, Styryl group, Acryl group, Methacryl group, Acryloyl group, Epoxy group, Carbon-carbon double bond | Acryl group |
| Epoxy resin | Addition polymerization reaction | Hydroxyl group, Epoxy group, Alkyl group-substituted amino group | Epoxy group |

To the silicone resin, the epoxy resin and the acrylic resin, antioxidants, releasants, coupling agents, and inorganic fillers may be added as long as the characteristics are not impaired.

In the inorganic oxide particle-containing resin composition, the content of the inorganic oxide particles is preferably 1% by weight or more and 80% by weight or less, more preferably 10% by weight or more and 80% by weight or less, and still more preferably 10% by weight or more and 50% by weight or less.

The content of the inorganic oxide particles is limited to 1% by weight or more and 80% by weight or less for the following reasons. 1% by weight as the lower limit is the minimum value which enables an improvement in the refractive index and mechanical characteristics, while 80% by weight as the upper limit is the maximum value of an addition rate which can maintain characteristics (flexibility, specific gravity) of the resin itself.

The visible light transmittance of the inorganic oxide particle-containing resin composition varies depending on the composition and the content of the inorganic oxide. When the content of the inorganic oxide is 25% by weight, the visible light transmittance at the light path length of 1 mm is preferably 90% or more, and more preferably 92% or more.

For example, when zirconia particles are used as the inorganic oxide particles, the visible light transmittance at the light path length of 1 mm is 95% or more when the content of the zirconia particles is 1% by weight, and is 80% or more when the content of the zirconia particles is 40% by weight.

Since zirconia particles have a refractive index of 2.15, the refractive index of the resin can be further increased by zirconia particles in the resin as compared with the refractive index of about 1.4 in the case of the acrylic resin and the silicone resin, and the refractive index of about 1.5 in the case of the epoxy resin.

The zirconia particles are suited to improve mechanical characteristics of the composite since the zirconia particles have high tenacity and hardness.

Less light scattering occurs and transparency of the composite material can be maintained even when composited with the resin since the zirconia particles are nanometer-sized particles having a particle diameter of 1 nm or more and 20 nm or less.

One example of the inorganic oxide particle-containing resin composition of the present invention includes an optical element made of a silicone resin. This optical element is produced by placing one or plural kinds of organopolysiloxanes, curing agents and catalysts in a mold, thermocuring them in the mold, and forming into a molded article having a predetermined shape. As the thermocuring reaction, reactions such as condensation crosslinking, peroxide crosslinking, and platinum addition crosslinking reactions can be used. Thermocuring through the addition polymerization reaction using a platinum catalyst is particularly preferred.

Method for Producing Inorganic Oxide Particle-Containing Resin Composition
(Transparent Composite)

The inorganic oxide particle-containing resin composition of the present invention can be produced by the following method.

First, the above transparent inorganic oxide dispersion of the present invention is mixed with a monomer or an oligomer of a resin using a mixer to prepare a resin composition in an easily flowable state.

Then, the resin composition is molded using a mold or filled into a mold or a container, and the molded article or the filling material is heated or irradiated with ultraviolet light or infrared light thereby curing the molded article or the filling material.

When the monomer or oligomer of the resin contains a carbon double bond (C=C) having reactivity, it can be polymerized and formed into a resin only by mixing.

The method of curing a resin composition containing an ultraviolet (UV) curable resin such as an acrylic resin include various methods, and typical examples thereof include a mold forming method using the radical polymerization reaction which is initiated by heating or irradiation with light, and a transfer molding method. Examples of the radical polymerization reaction include a polymerization reaction (thermopolymerization) using heat, a polymerization reaction (photopolymerization) using ultraviolet light, a polymerization reaction using a gamma ($\gamma$) ray, or a combination thereof.

(Composition for Sealing Light Emitting Element)

The composition for sealing a light emitting element of the present invention is obtained by mixing the transparent inorganic oxide dispersion of the present invention, namely, a dispersion containing inorganic oxide particles which have a surface modified with a surface modifier having one or more reactive functional groups and have a disperse particle diameter of 1 nm or more and 20 nm or less, and a disperse medium, with the above silicone resin, epoxy resin and acrylic resin, and is a fluid with fluidity.

Light Emitting Element

The light emitting element of the present invention is a light emitting element in which at least a light transmitting region is composed of the inorganic oxide particle-containing resin composition of the present invention. The light transmitting region of the light emitting element is sealed with the inorganic oxide particle-containing resin composition of the present invention by filling at least the above composition for sealing a light emitting element in the light transmitting region of the light emitting element, heating the filling material or irradiating it with ultraviolet light or infrared light, thereby curing the filling material.

According to the light emitting element, the light transmitting region has a high light transmittance, a high refractive index and high hardness since the light transmitting region was sealed with a sealing material (composition) which has a high refractive index and excellent mechanical characteristics and is also excellent in transparency. Therefore, light extraction efficiency of the light emitting element can be improved and thus luminescent brightness can be improved.

EXAMPLES

The present invention will now be described in detail below by way of Examples and Comparative Examples, but the present invention is not limited to the following Examples.
(Preparation and Evaluation of Transparent Inorganic Oxide Dispersion (Transparent Zirconia Dispersion))

Example 1

To a zirconium salt solution containing 2,615 g of zirconium oxychloride octahydrate dissolved in pure 40 L (liter) of water, diluted ammonia water containing 344 g of 28% ammonia water in 20 L of pure water was added while stirring to prepare a zirconia precursor slurry.

To the slurry, a sodium sulfate aqueous solution containing 300 g of sodium sulfate in 5 L of pure water was added while stirring. The amount of sodium sulfate was 30% by weight based on zirconia ions as zirconia in the zirconium salt solution.

The mixture was dried in atmospheric air at 130° C. for 24 hours using a dryer to obtain a solid matter.

The solid matter was ground by an automatic mortar and then calcined in atmospheric air at 500° C. for one hour using an electric furnace.

The calcined material was put in pure water and stirred to form a slurry, which was washed using a centrifuge. After sodium sulfate added was sufficiently removed, the residue was dried by a dryer to produce zirconia particles.

To 10 g of the zirconia particles, 85 g of toluene as a disperse medium and 5 g of a silane coupling agent KBM-1403 (manufactured by Shin-Etsu Chemical Co., Ltd.) as a surface modifier were added, followed by mixing, thereby modifying the surface of the tetragonal zirconia particles with the surface modifier. Then, a dispersion treatment was carried out to prepare a transparent inorganic oxide dispersion (Z1) of Example 1.

Then, the disperse particle diameter of zirconia particles of the transparent inorganic oxide dispersion, and the visible light transmittance of the dispersion were measured.

The disperse particle diameter was measured by the following procedure. A dynamic light scattering type particle size distribution analyzer (manufactured by Malvern Co.) was used and a measuring sample was made by adjusting the content of zirconia particles in the transparent inorganic oxide dispersion to 1% by weight. The measuring temperature was 25° C. Regarding data analysis conditions, the particle diameter was on a volume basis, the refractive index of zirconia as disperse particles was 2.15, and the refractive index of toluene as a disperse medium was 1.49.

The visible light transmittance of the dispersion was measured by the following procedure. A sample obtained by adjusting the content of zirconia of the dispersion to 5% by weight using toluene was placed in a quartz cell (10 mm×10 mm) and visible light transmittance at a light path length of 10 mm was measured using a spectrophotometer (manufactured by JASCO Corporation). Samples having a light transmittance of 80% or more were rate "Good", whereas, samples having a light transmittance of less than 80% were rate "Poor".

These measurement results are shown in Table 2.

The crystal system of zirconia particles of the dispersion was examined using an X-ray diffractometer.

A powder X-ray diffraction pattern (chart) of zirconia particles is shown in FIG. 1. The powder X-ray diffraction pattern revealed that the crystal system of zirconia particles is a tetragonal system.

Example 2

In the same manner as in Example 1, zirconia particles were synthesized to produce zirconia particles.

To 10 g of the zirconia particles, 85 g of toluene as a disperse medium and 5 g of a methoxy modified silicone KR-213 (manufactured by Shin-Etsu Chemical Co., Ltd.) as a surface modifier were added, followed by mixing and a dispersion treatment to prepare a transparent inorganic oxide dispersion (Z2) of Example 2.

In the same manner as in Example 1, the disperse particle diameter and the visible light transmittance of zirconia particles were measured. The measurement results are shown in Table 2.

Comparative Example 1

In the same manner as in Example 1, zirconia particles were synthesized to produce zirconia particles.

To 10 g of the zirconia particles, 89.6 g of toluene as a disperse medium and 0.4 g of a silane coupling agent KBM-1403 (manufactured by Shin-Etsu Chemical Co., Ltd.) as a surface modifier were added, followed by mixing and a dispersion treatment to prepare a zirconia dispersion (Z3) of Comparative Example 1.

In the same manner as in Example 1, the disperse particle diameter and the visible light transmittance of zirconia particles were measured. The measurement results are shown in Table 2.

Comparative Example 2

In the same manner as in Example 1, zirconia particles were synthesized to produce zirconia particles.

To 10 g of the zirconia particles, 90 g of toluene as a disperse medium was added, followed by mixing and a dispersion treatment to prepare a zirconia dispersion (Z4) of Comparative Example 2.

The surface is not modified with the surface modifier since the surface modifier was not added to the tetragonal zirconia particles of the zirconia dispersion (Z4).

In the same manner as in Example 1, the disperse particle diameter and the visible light transmittance of zirconia particles were measured. The measurement results are shown in Table 2.

Comparative Example 3

In the same manner as in Example 1, except that RC-100 (manufactured by DAIICHI KIGENSO KAGAKU KOGYO CO., LTD.) was used as zirconia particles, a dispersion treatment was carried out to prepare a zirconia dispersion (Z5) of Comparative Example 3.

In the same manner as in Example 1, the disperse particle diameter and the visible light transmittance of zirconia particles were measured. The measurement results are shown in Table 2.

TABLE 2

| | Kind of dispersion | Disperse particle diameter (nm) | Visible light transmittance (%) |
|---|---|---|---|
| Example 1 | Z1 | 8 | 93 |
| Example 2 | Z2 | 9 | 92 |
| Comparative Example 1 | Z3 | 100 | 11 |
| Comparative Example 2 | Z4 | Not dispersed | Impossible to measure |
| Comparative Example 3 | Z5 | 100 | 9 |

(Preparation of Inorganic Oxide Particle-Containing Resin Composition (Transparent Composite))

Example 3

To 100 g of the transparent inorganic oxide dispersion (Z1) of Example 1, 10 g of silicone oil (mixture of methylhydrodienepolysiloxane and organopolysiloxane having a vinyl group at both ends) was added and also chloroplatinic acid was added in an amount of 20 ppm based on 100 parts by weight of silicone oil, followed by removal of the solvent through vacuum drying to prepare a resin composition.

The resin composition was poured into a mold assembled using a glass plate in a thickness of 1 mm and then cured by heating at 150° C. for 2 hours to prepare an inorganic oxide particle-containing resin composition of Example 3.

The content of zirconia of the inorganic oxide particle-containing resin composition was 50% by weight.

Example 4

To 100 g of the transparent inorganic oxide dispersion (Z1) of Example 1, 7 g of an epoxy resin: Epicoat 828 and 3 g of Epicure 3080 as a curing agent (both are manufactured by Japan Epoxy Resins Co., Ltd.) were added, followed by removal of the solvent through vacuum drying to prepare a resin composition.

The resin composition was poured into a mold assembled using a glass plate in a thickness of 1 mm and then cured by heating at 80° C. for 30 minutes to prepare an inorganic oxide particle-containing resin composition of Example 4.

The content of zirconia of the inorganic oxide particle-containing resin composition was 50% by weight.

Example 5

To 100 g of the transparent inorganic oxide dispersion (Z1) of Example 1, 5 g of 1,6-hexanediol diacrylate, 2.5 g of pentaerythritol triacrylate, 2 g of pentaerythritol tetraacrylate and 0.5 g of benzoyl peroxide as a polymerization initiator were added, followed by removal of the solvent through vacuum drying to prepare a resin composition.

The resin composition was poured into a mold assembled using a glass plate in a thickness of 1 mm and then cured by heating at 60° C. for 5 hours, followed by heating at 120° C. for 2 hours to prepare an inorganic oxide particle-containing resin composition of Example 5.

The content of zirconia of the inorganic oxide particle-containing resin composition was 50% by weight.

Comparative Example 4

To 100 g of the transparent inorganic oxide dispersion (Z3) of Comparative Example 1, 10 g of silicone oil (mixture of methylhydrodienepolysiloxane and organopolysiloxane having a vinyl group at both ends) was added and also chloroplatinic acid was added in an amount of 20 ppm based on 100 parts by weight of silicone oil, followed by removal of the solvent through vacuum drying to prepare a resin composition.

In the same manner as in Example 3, the resin composition was treated to prepare an inorganic oxide particle-containing resin composition of Comparative Example 4.

The content of zirconia of the inorganic oxide particle-containing resin composition was 50% by weight.

Comparative Example 5

To 100 g of the transparent inorganic oxide dispersion (Z3) of Comparative Example 1, 7 g of an epoxy resin: Epicoat 828 and 3 g of Epicure 3080 as a curing agent (both are manufactured by Japan Epoxy Resins Co., Ltd.) were added, followed by removal of the solvent through vacuum drying to prepare a resin composition.

In the same manner as in Example 4, the resin composition was treated to prepare an inorganic oxide particle-containing resin composition of Comparative Example 5.

The content of zirconia of the inorganic oxide particle-containing resin composition was 50% by weight.

Comparative Example 6

To 100 g of the transparent inorganic oxide dispersion (Z3) of Comparative Example 1, 5 g of 1,6-hexanediol diacrylate, 2.5 g of pentaerythritol triacrylate, 2 g of pentaerythritol tetraacrylate and 0.5 g of benzoyl peroxide as a polymerization initiator were added, followed by removal of the solvent through vacuum drying to prepare a resin composition.

In the same manner as in Example 5, the resin composition was treated to prepare an inorganic oxide particle-containing resin composition of Comparative Example 6.

The content of zirconia of the inorganic oxide particle-containing resin composition was 50% by weight.

Comparative Example 7

In the same manner as in Comparative Example 4, except that the content of zirconia of the inorganic oxide particle-containing resin composition was adjusted to 1% by weight, a treatment was carried out to prepare an inorganic oxide particle-containing resin composition of Comparative Example 7.

Comparative Example 8

In the same manner as in Comparative Example 5, except that the content of zirconia of the inorganic oxide particle-containing resin composition was adjusted to 1% by weight, a treatment was carried out to prepare an inorganic oxide particle-containing resin composition of Comparative Example 8.

Comparative Example 9

In the same manner as in Comparative Example 6, except that the content of zirconia of the inorganic oxide particle-containing resin composition was adjusted to 1% by weight, a treatment was carried out to prepare an inorganic oxide particle-containing resin composition of Comparative Example 9.

Comparative Example 10

In the same manner as in Comparative Example 4, except that the zirconia dispersion (Z5) of Comparative Example 3 was used, a treatment was carried out to prepare an inorganic oxide particle-containing resin composition of Comparative Example 10.

Comparative Example 11

In the same manner as in Comparative Example 5, except that the zirconia dispersion (Z5) of Comparative Example 3 was used, a treatment was carried out to prepare an inorganic oxide particle-containing resin composition of Comparative Example 11.

Comparative Example 12

In the same manner as in Comparative Example 6, except that the zirconia dispersion (Z5) of Comparative Example 3 was used, a treatment was carried out to prepare an inorganic oxide particle-containing resin composition of Comparative Example 12.

Evaluation of Inorganic Oxide Particle-Containing Resin Composition

With respect to the inorganic oxide particle-containing resin compositions of Examples 3 to 5 and Comparative Examples 4 to 12, the three items, visible light transmittance, a refractive index and hardness, were evaluated by the following apparatuses and procedures.

(1) Visible Light Transmittance

Using a spectrophotometer (manufactured by JASCO Corporation), light transmittance of visible light was measured.

A bulk material measuring 100×100×1 mm was used as a measuring sample. Samples having a light transmittance of 80% or more were rated "Good", whereas, samples having a light transmittance of less than 80% were rated "Poor".

(2) Refractive Index

In accordance with the method for measuring the refractive index of a plastic defined in Japanese Industrial Standard: JIS K 7142, the refractive index was measured by an Abbe refractometer.

A resin containing no zirconia added therein was used as a standard sample. Samples where the refractive index was improved by 0.05 or more were rated "Good", whereas, samples where the refractive index was improved by less than 0.05 were rated "Poor".

(3) Hardness

In accordance with a method for a durometer hardness test of a plastic defined in Japanese Industrial Standard: JIS K 7215, JIS-A hardness was measured using a durometer.

The hardness of each inorganic oxide particle-containing resin composition containing 50% by weight of zirconia prepared by resin compositions of Comparative Examples 10 to 12 using the zirconia dispersion (Z5) of Comparative Example 3 was used as a standard. Samples having a hardness higher than the standard value were rated "Good", whereas, samples having a hardness lower than the standard value were rated "Poor".

The above evaluation results are shown in Table 3.

TABLE 3

| | Kind of dispersion | Kind of resin | Content of zirconia (% by weight) | Visible light transmittance (%) | Refractive index | Hardness |
|---|---|---|---|---|---|---|
| Example 3 | Z1 | Silicone resin | 50 | Good | Good | Good |
| Example 4 | Z1 | Epoxy resin | 50 | Good | Good | Good |
| Example 5 | Z1 | Acrylic resin | 50 | Good | Good | Good |
| Comparative Example 4 | Z3 | Silicone resin | 50 | Poor | Good | Good |
| Comparative Example 5 | Z3 | Epoxy resin | 50 | Poor | Good | Good |
| Comparative Example 6 | Z3 | Acrylic resin | 50 | Poor | Good | Good |
| Comparative Example 7 | Z3 | Silicone resin | 1 | Good | Poor | Poor |
| Comparative Example 8 | Z3 | Epoxy resin | 1 | Good | Poor | Poor |
| Comparative Example 9 | Z3 | Acrylic resin | 1 | Good | Poor | Poor |
| Comparative Example 10 | Z5 | Silicone resin | 50 | Poor | Good | Standard |
| Comparative Example 11 | Z5 | Epoxy resin | 50 | Poor | Good | Standard |
| Comparative Example 12 | Z5 | Acrylic resin | 50 | Poor | Good | Standard |

(Note)
Z1: Transparent zirconia dispersion of Example 1
Z3: Zirconia dispersion of Comparative Example 1
Z5: Zirconia dispersion of Comparative Example 3

As is apparent from these evaluation results, all of visible light transmittance, refractive index and hardness are excellent in Examples 3 to 5.

In Comparative Examples 4 to 12, any one characteristic of visible light transmittance, refractive index and hardness was inferior as compared with Examples 3 to 5.

Example 6

Preparation of Transparent Inorganic Oxide Dispersion (Transparent Zirconia Dispersion)

In the same manner as in Example 1, particles were synthesized to produce zirconia particles.

To 10 g of the zirconia particles, 85 g of toluene as a disperse medium and 5 g of a silane coupling agent having a carbon-carbon double bond, vinyltrimethoxysilane, as a surface modifier were added, followed by mixing, thereby modifying the surface of the zirconia particles with the surface modifier. Herein, KBM-1003 (manufactured by Shin-Etsu Chemical Co., Ltd.) was used as vinyltrimethoxysilane.

Then, a dispersion treatment was carried out to prepare a transparent inorganic oxide dispersion (Z6) of Example 6.

Then, the disperse particle diameter of zirconia particles of the transparent inorganic oxide dispersion, and the visible light transmittance of the dispersion were measured.

The disperse particle diameter was measured by the following procedure. A dynamic light scattering type particle size distribution analyzer (manufactured by Malvern Co.) was used and a measuring sample was made by adjusting the content of zirconia particles in a transparent inorganic oxide dispersion to 1% by weight. Regarding data analysis conditions, the particle diameter was on a volume basis, the refractive index of zirconia as disperse particles was 2.15, and the refractive index of toluene as a disperse medium was 1.49.

The visible light transmittance of the dispersion was measured by the following procedure. A sample obtained by adjusting the content of zirconia of the dispersion to 5% by weight using toluene was placed in a quartz cell (10 mm×10 mm) and the visible light transmittance at a light path length of 10 mm was measured using a spectrophotometer (manufactured by JASCO Corporation). Samples having a light transmittance of 80% or more were rate "Good", whereas, samples having a light transmittance of less than 80% were rate "Poor".

These measurement results are shown in Table 4.

The crystal system of zirconia particles of the dispersion was examined using an X-ray diffractometer.

A powder X-ray diffraction pattern (chart) of zirconia particles is shown in FIG. 1. The powder X-ray diffraction pattern revealed that the crystal system of zirconia particles is a tetragonal system.

Example 7

In the same manner as in Example 1, zirconia particles were synthesized to produce zirconia particles.

To 10 g of the zirconia particles, 85 g of toluene as a disperse medium and 5 g of a silane coupling agent having an acryl group, 3-methacryloxypropyltrimethoxysilane, as a surface modifier were added, followed by mixing and a dispersion treatment to prepare a transparent inorganic oxide dispersion (Z7) of Example 7. Herein, KBM-503 (manufactured by Shin-Etsu Chemical Co., Ltd.) was used as 3-methacryloxypropyltrimethoxysilane.

In the same manner as in Example 6, the disperse particle diameter and the visible light transmittance of zirconia particles were measured. The measurement results are shown in Table 4.

Example 8

In the same manner as in Example 1, zirconia particles were synthesized to produce zirconia particles.

To 10 g of the zirconia particles, 85 g of toluene as a disperse medium and 5 g of a silane coupling agent having an epoxy group, 3-glycidoxypropyltrimethoxysilane, as a surface modifier were added, followed by mixing and a dispersion treatment to prepare a transparent inorganic oxide dispersion (Z8) of Example 8. Herein, KBM-403 (manufactured by Shin-Etsu Chemical Co., Ltd.) was used as 3-glycidoxypropyltrimethoxysilane.

In the same manner as in Example 6, the disperse particle diameter and the visible light transmittance of zirconia particles were measured. The measurement results are shown in Table 4.

Comparative Example 13

In the same manner as in Example 1, zirconia particles were synthesized to produce zirconia particles.

To 10 g of the zirconia particles, 85 g of toluene as a disperse medium and 5 g of a silane coupling agent having no reactive functional group, decyltrimethoxysilane, as a surface modifier were added, followed by mixing and a dispersion treatment to prepare a transparent inorganic oxide dispersion (Z9) of Comparative Example 13. Herein, KBM-3103C (manufactured by Shin-Etsu Chemical Co., Ltd.) was used as decyltrimethoxysilane.

In the same manner as in Example 6, the disperse particle diameter and the visible light transmittance of zirconia particles were measured. The measurement results are shown in Table 4.

Comparative Example 14

In the same manner as in Example 1, zirconia particles were synthesized to produce zirconia particles.

To 10 g of the zirconia particles, 89.6 g of toluene as a disperse medium and 0.4 g of a silane coupling agent having an epoxy group, 3-glycidoxypropyltrimethoxysilane, as a surface modifier were added, followed by mixing and a dispersion treatment to prepare a zirconia dispersion (Z10) of Comparative Example 14. Herein, KBM-403 (manufactured by Shin-Etsu Chemical Co., Ltd.) was used as 3-glycidoxypropyltrimethoxysilane.

In the same manner as in Example 6, the disperse particle diameter and the visible light transmittance of zirconia particles were measured. The measurement results are shown in Table 4.

Comparative Example 15

In the same manner as in Example 1, zirconia particles were synthesized to produce zirconia particles.

To 10 g of the zirconia particles, 90 g of toluene as a disperse medium was added, followed by mixing and a dispersion treatment to prepare a zirconia dispersion (Z11) of Comparative Example 15. The surface is not modified with the surface modifier since the surface modifier was not added to the tetragonal zirconia particles of the zirconia dispersion (Z11).

In the same manner as in Example 1, the disperse particle diameter and the visible light transmittance of zirconia particles were measured. The measurement results are shown in Table 4.

TABLE 4

| | Kind of dispersion | Surface modification conditions of zirconia particles | Disperse particle diameter (nm) | Visible light transmittance (%) |
|---|---|---|---|---|
| Example 6 | Z6 | Silane coupling agent having a carbon-carbon double bond (KBM-1003: Vinyltrimethoxysilane) | 8 | 93 |
| Example 7 | Z7 | Silane coupling agent having an acryl group (KBM-503: 3-methacryloxypropyltrimethoxysilane) | 9 | 92 |
| Example 8 | Z8 | Silane coupling agent having an epoxy group (KBM-403: 3-glycidoxypropyltrimethoxysilane) | 9 | 93 |
| Comparative Example 13 | Z9 | Silane coupling agent having no reactive functional group (KBM3103C: Decyltrimethoxysilane) | 8 | 92 |
| Comparative Example 14 | Z10 | Small mount of surface modifier | 100 | 11 |
| Comparative Example 15 | Z11 | No surface modifier | Not dispersed | Impossible to measure |

(Preparation of Inorganic Oxide Particle-Containing Resin Composition (Transparent Composite))

Example 9

To 100 g of the transparent inorganic oxide dispersion (Z6) of Example 6, 10 g of silicone oil (mixture of methylhydrodienepolysiloxane and organopolysiloxane having a vinyl group at both ends) was added and also chloroplatinic acid was added in an amount of 20 ppm based on 100 parts by weight of silicone oil, followed by removal of the solvent through vacuum drying to prepare a resin composition.

The resin composition was poured into a mold assembled using a glass plate in a thickness of 1 mm and then cured by heating at 150° C. for 2 hours to prepare an inorganic oxide particle-containing resin composition of Example 9.

The content of zirconia of the inorganic oxide particle-containing resin composition was 50% by weight.

Example 10

To 100 g of the transparent inorganic oxide dispersion (Z7) of Example 7, 5 g of 1,6-hexanediol diacrylate, 2.5 g of pentaerythritol triacrylate, 2 g of pentaerythritol tetraacrylate, and 0.5 g of benzoyl peroxide as a polymerization initiator were added, followed by removal of the solvent through vacuum drying to prepare a resin composition.

The resin composition was poured into a mold assembled using a glass plate in a thickness of 1 mm and then cured by heating at 60° C. for 5 hours, followed by heating at 120° C. for 2 hours to prepare an inorganic oxide particle-containing resin composition of Example 10.

The content of zirconia of the inorganic oxide particle-containing resin composition was 50% by weight.

Example 11

To 100 g of the transparent inorganic oxide dispersion (Z8) of Example 8, 7 g of an epoxy resin: Epicoat 828 and 3 g of Epicure 3080 as a curing agent (both are manufactured by Japan Epoxy Resins Co., Ltd.) were added, followed by removal of the solvent through vacuum drying to prepare a resin composition.

The resin composition was poured into a mold assembled using a glass plate in a thickness of 1 mm and then cured by heating at 80° C. for 30 minutes to prepare an inorganic oxide particle-containing resin composition of Example 11.

The content of zirconia of the inorganic oxide particle-containing resin composition was 50% by weight.

Comparative Example 16

In the same manner as in Example 9, except that the transparent inorganic oxide dispersion (Z9) of Comparative Example 13 was used, a treatment was carried out to prepare an inorganic oxide particle-containing resin composition of Comparative Example 16.

Comparative Example 17

In the same manner as in Example 10, except that the transparent inorganic oxide dispersion (Z9) of Comparative Example 13 was used, a treatment was carried out to prepare an inorganic oxide particle-containing resin composition of Comparative Example 17.

Comparative Example 18

In the same manner as in Example 11, except that the transparent inorganic oxide dispersion (Z9) of Comparative Example 13 was used, a treatment was carried out to prepare an inorganic oxide particle-containing resin composition of Comparative Example 18.

Comparative Example 19

In the same manner as in Example 9, except that the zirconia dispersion (Z10) of Comparative Example 14 was used, a treatment was carried out to prepare an inorganic oxide particle-containing resin composition of Comparative Example 19.

Comparative Example 20

In the same manner as in Example 10, except that the zirconia dispersion (Z10) of Comparative Example 14 was used, a treatment was carried out to prepare an inorganic oxide particle-containing resin composition of Comparative Example 20.

Comparative Example 21

In the same manner as in Example 11, except that the zirconia dispersion (Z10) of Comparative Example 14 was used, a treatment was carried out to prepare an inorganic oxide particle-containing resin composition of Comparative Example 21.

Comparative Example 22

In the same manner as in Comparative Example 19, except that the content of zirconia of the inorganic oxide particle-containing resin composition was adjusted to 1% by weight, a treatment was carried out to prepare an inorganic oxide particle-containing resin composition of Comparative Example 22.

Comparative Example 23

In the same manner as in Comparative Example 20, except that the content of zirconia of the inorganic oxide particle-containing resin composition was adjusted to 1% by weight, a treatment was carried out to prepare an inorganic oxide particle-containing resin composition of Comparative Example 23.

Comparative Example 24

In the same manner as in Comparative Example 21, except that the content of zirconia of the inorganic oxide particle-containing resin composition was adjusted to 1% by weight, a treatment was carried out to prepare an inorganic oxide particle-containing resin composition of Comparative Example 24.

Evaluation of Inorganic Oxide Particle-Containing Resin Composition

With respect to the inorganic oxide particle-containing resin compositions of Examples 9 to 11 and Comparative Examples 16 to 24, the three items visible light transmittance, refractive index and hardness were evaluated by the following apparatuses and procedures.

(1) Visible Light Transmittance

Using a spectrophotometer (manufactured by JASCO Corporation), light transmittance of visible light was measured.

A bulk material measuring 100×100×1 mm was used as a measuring sample. Samples having a light transmittance of 80% or more were rated "Good", whereas, samples having a light transmittance of less than 80% were rated "Poor".

(2) Refractive Index

In accordance with the method for measuring the refractive index of a plastic defined in Japanese Industrial Standard: JIS K 7142, the refractive index was measured by an Abbe refractometer.

A resin containing no zirconia added therein was used as a standard sample. Samples where the refractive index was improved by 0.05 or more were rated "Good", whereas, samples where the refractive index was improved by less than 0.05 were rated "Poor".

(3) Hardness

In accordance with a method for a durometer hardness test of a plastic defined in Japanese Industrial Standard: JIS K 7215, JIS-A hardness was measured using a durometer.

The hardness of each inorganic oxide particle-containing resin composition containing 50% by weight of zirconia prepared by resin compositions of Comparative Examples 16 to 18 using the zirconia dispersion (Z9) of Comparative Example 13 was used as a standard. Samples having a hardness higher than the standard value were rated "Good", whereas, samples having a hardness lower than the standard value were rated "Poor".

The above evaluation results are shown in Table 5.

TABLE 5

| | | Dispersion | | Content of | Visible light | | |
| --- | --- | --- | --- | --- | --- | --- | --- |
| | Kind | Disperse particle diameter (nm) | Kind of resin | zirconia (% by weight) | transmittance (%) | Refractive index | Hardness |
| Example 9 | Z6 | 8 | Silicone | 50 | Good | Good | Good |
| Example 10 | Z7 | 9 | Acrylic | 50 | Good | Good | Good |
| Example 11 | Z8 | 9 | Epoxy | 50 | Good | Good | Good |
| Comparative Example 16 | Z9 | 8 | Silicone | 50 | Good | Good | Standard |
| Comparative Example 17 | Z9 | 8 | Acrylic | 50 | Good | Good | Standard |
| Comparative Example 18 | Z9 | 8 | Epoxy | 50 | Good | Good | Standard |
| Comparative Example 19 | Z10 | 100 | Silicone | 50 | Poor | Good | Good |
| Comparative Example 20 | Z10 | 100 | Acrylic | 50 | Poor | Good | Good |
| Comparative Example 21 | Z10 | 100 | Epoxy | 50 | Poor | Good | Good |
| Comparative Example 22 | Z10 | 100 | Silicone | 1 | Good | Poor | Poor |
| Comparative Example 23 | Z10 | 100 | Acrylic | 1 | Good | Poor | Poor |
| Comparative Example 24 | Z10 | 100 | Epoxy | 1 | Good | Poor | Poor |

As is apparent from these evaluation results, all of visible light transmittance, refractive index and hardness are excellent in Examples 9 to 11.

In Comparative Examples 16 to 24, any one characteristic of visible light transmittance, refractive index and hardness was inferior as compared with Examples 9 to 11.

The best mode for carrying out the composition for sealing a light emitting element, the light emitting element and the optical semiconductor device of the present invention will be described below.

This mode is described in detail for purposes of clarity of understanding of the purport of the invention, and the present invention is not to be limited thereto unless otherwise specified.

Figure 2:
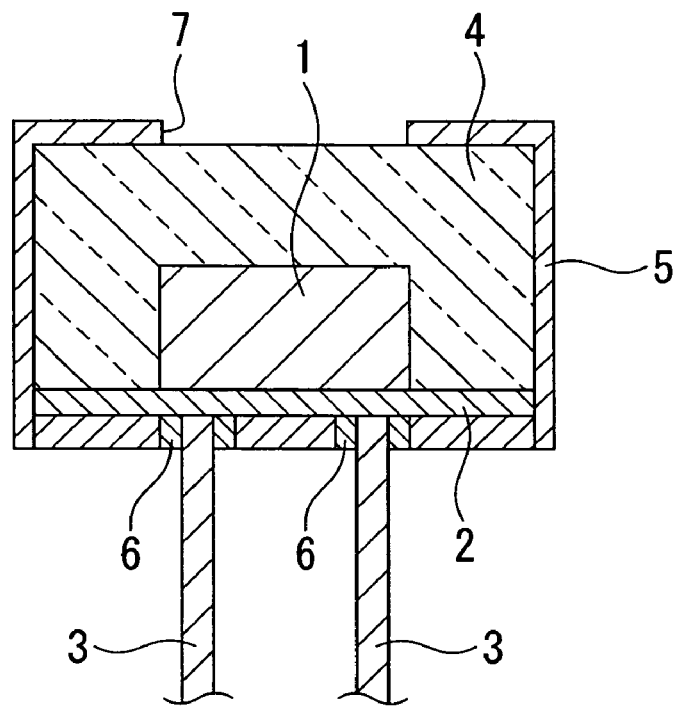
FIG. 2 is a sectional view showing a light emitting diode according to one embodiment of the present invention.

FIG. 2 is a sectional view showing a light emitting diode (LED) according to one embodiment of the present invention.

In the drawing, the reference numeral 1 denotes an LED chip made of a III-V group compound semiconductor, 2 denotes a lead frame on which the LED chip 1 is loaded, 3 denotes an external terminal to be pulled out from the lead frame, 4 denotes a sealing material (composition for sealing a light emitting element) for sealing the LED chip 1 and the lead frame 2, which exerts both a protective function and a lens function, 5 denotes a metal case for housing the LED chip 1 and the lead frame 2, 6 denotes an insulating material for insulting the external terminal 3, and 7 denotes an aperture portion formed on the metal case 5.

The LED chip 1 is a chip in which a III-V group compound semiconductor, for example, a gallium nitride-based compound semiconductor made of GaN, GaAlN, InGaN, or InGaN is laminated on a crystal substrate made of sapphire.

The sealing material 4 is an inorganic oxide particle-containing resin composition in which inorganic oxide particles having a disperse particle diameter of 1 nm or more and 20 nm or less and a refractive index of 1.8 or more are dispersed in a transparent silicone resin.

Examples of the inorganic oxide particles having a refractive index of 1.8 or more include, but are not limited to, oxide particles containing one or more kinds selected from the group consisting of Zr, Ti, Sn, Si, Al, Fe, Cu, Zn, Y, Nb, Mo, In, Ta, W, Pb, Bi, Ce, Sb, and Ge. Specific examples of the oxide include $ZrO_2$, $TiO_2$, $SnO_2$, $Al_2O_3$, $Fe_2O_3$, CuO, ZnO, $Y_2O_3$, $Nb_2O_5$, $MoO_3$, $In_2O_3$, $Ta_2O_5$, $WO_3$, PbO, $Bi_2O_3$, $CeO_2$, $Sb_2O_5$, antimony-added tin oxide (ATO: Antimony Tin Oxide), and tin-added indium oxide (ITO: Indium Tin Oxide).

The disperse particle diameter of the inorganic oxide is limited to 1 nm or more and 20 nm or less for the following reasons. When the disperse particle diameter is less than 1 nm, crystallinity deteriorates and it becomes difficult to exhibit particle characteristics such as refractive index. In contrast, when the disperse particle diameter is more than 20 nm, transparency deteriorates when formed into a dispersion or an inorganic oxide particle-containing resin composition.

As described above, inorganic oxide particles are nanometer-sized particles, and thus less light scattering occurs and transparency of the composite can be maintained even in the inorganic oxide particles composited with the resin.

The refractive index of the inorganic oxide particles is limited to 1.8 or more for the following reason. The refractive index of 1.8 or more is required so as to obtain the effect of ensuring a high refractive index through addition since the resin used as a LED sealing material has a refractive index of about 1.4.

The resin may be a resin which has transparency to light emitted from the LED chip 1, for example, light having a predetermined wavelength region, such as visible light or near infrared light, and it is possible to preferably use curable resins having thermoplasticity, thermocurability, light (electromagnetic wave) curability through visible light, ultraviolet light or infrared light, and electron curability through irradiation with an electron.

Examples of the resin include a silicone resin, an epoxy resin, and an acrylic resin. Of these resins, a silicone resin is particularly preferred.

The silicone resin is preferably composed of at least the following components (a) to (c):
(a) organopolysiloxane in which at least one group of functional groups combined with a silicon atom in a molecule is an alkenyl group, (b) linear organopolysiloxane in which at least two groups of functional groups combined with a silicon atom in a molecule is a hydrogen atom, or both ends of a molecular chain is blocked with a hydrogen atom, and (c) a catalyst for a hydrosilylation reaction.

Examples of the alkenyl group in the component (a) include a vinyl group, an allyl group, a pentenyl group, and a hexenyl group. Of these groups, a vinyl group is particularly preferred.

Examples of the functional group combined with a silicon atom other than the alkenyl group include an alkyl group such as a methyl group, an ethyl group, a propyl group, or a butyl group; an aryl group such as a phenyl group or a tolyl group; and an aralkyl group such as a benzyl group or a phenethyl group. Of these groups, a methyl group is particularly preferred.

Examples of the functional group combined with a silicon atom other than the hydrogen atom in the component (b) include an alkyl group such as a methyl group, an ethyl group, a propyl group, or a butyl group; an aryl group such as a phenyl group or a tolyl group; and an aralkyl group such as a benzyl group or a phenethyl group. Of these groups, a methyl group is particularly preferred.

The content of the component (b) is within a range from 0.1 to 10 mol, more preferably from 0.1 to 5 mol, and more preferably from 0.5 to 2 mol, in terms of a hydrogen atom based on 1 mol of the total alkenyl groups contained in the component (a).

The catalyst for the hydrosilylation reaction of the component (c) is a catalyst for promoting the hydrosilylation reaction between the alkenyl group in the component (a) and the hydrogen atom combined with the silicon atom in the component (b). Examples of the catalyst include a platinum-based catalyst, a rhodium-based catalyst, and a palladium-based catalyst. Of these catalysts, a platinum-based catalyst is particularly preferred.

Examples of the platinum-based catalyst include a fine platinum powder, chloroplatinic acid, a platinum-olefin complex, and a platinum carbonyl complex. Of these catalysts, chloroplatinic acid is particularly preferred.

The content of the component (c) may be an amount which enables promotion of curing of the present composition, namely, an amount which enables promotion of the hydrosilylation reaction between the alkenyl group in the component (a) and the hydrogen atom combined with the silicon atom in the component (b), and is not specifically limited. Specifically, the content of the metal atom in the present component is within a range from 0.01 to 500 ppm by weight, and more preferably 0.01 to 50 ppm by weight, based on the present composition.

The content of the metal atom in the present component is limited to the above range for the following reasons. When the content is less than 0.01 ppm, the present composition may not be sufficiently cured. In contrast, when the content is more than 500 ppm, the resulting cured article causes a problem such as coloration.

This silicone resin may contain heat-resistance improvers, dyes, pigments, and flame retardants as optional components as long as the objects of the present invention are not adversely affected.

To the silicone resin, the epoxy resin and the acrylic resin, antioxidants, releasants, coupling agents, and inorganic fillers may be added as long as the characteristics are not impaired.

The content of the inorganic oxide particles in the inorganic oxide particle-containing resin composition is preferably 1% by weight or more and 80% by weight or less, more preferably 10% by weight or more and 80% by weight or less, and still more preferably 10% by weight or more and 50% by weight or less.

The content of the inorganic oxide particles is limited to 1% by weight or more and 80% by weight or less for the following reasons. 1% by weight as the lower limit is the minimum value which enables an improvement in the refractive index and mechanical characteristics, while 80% by weight as the upper limit is the maximum value of an addition rate which can maintain characteristics (flexibility, specific gravity) of the resin itself.

In the inorganic oxide particle-containing resin composition, when the wavelength of emitted light is 450 nm, the light transmittance at a light path length of 1 mm is preferably 80% or more, and more preferably 85% or more.

The light transmittance varies depending on the content of the inorganic oxide particles in the inorganic oxide particle-containing resin composition. The light transmittance is 90% or more when the content of the inorganic oxide particles is 1% by weight, and is 80% or more when the content of the inorganic oxide particles is 40% by weight.

The refractive index of the resin can be further increased by dispersing the inorganic oxide particles in the resin as compared with the refractive index of about 1.4 of the silicone resin since the refractive index of the inorganic oxide particles is 1.8 or more.

Less light scattering occurs and transparency of the composite material can be maintained even when composited with the resin since the zirconia particles are nanometer-sized particles having a particle diameter of 1 nm or more and 20 nm or less.

In the light emitting diode, the region from the LED chip 1 to the aperture portion 7 of the metal case 5 is a transmitting region of light emitted from the LED chip 1, and the light transmitting region is sealed with the sealing material 4 composed of an inorganic oxide particle-containing resin composition in which inorganic oxide particles having a disperse particle diameter of 1 nm or more and 20 nm or less and a refractive index of 1.8 or more are dispersed in a transparent silicone resin. Therefore, the light transmitting region has a high light transmittance, a high refractive index, high thermostability, high hardness, and excellent weatherability.

Therefore, light extraction efficiency of the light emitting diode is improved and thus luminescent brightness is improved.

The method for producing this light emitting diode will be described below.

First, the LED chip 1 is loaded at a predetermined position of the lead frame 2 and the LED chip 1 is electrically connected with the lead frame 2 using wire bonding (not shown). Then, the unnecessary portion of the lead of the lead frame 2 is cut and the remaining lead was bent to obtain an external terminal 3.

Next, the LED chip 1 and the lead frame 2 are sealed with a sealing material 4 composed of an inorganic oxide particle-containing resin composition in which inorganic oxide particles having a disperse particle diameter of 1 nm or more and 20 nm or less and a refractive index of 1.8 or more are dispersed in a transparent silicone resin.

When a resin composition constituting the sealing material 4 is prepared, the above transparent inorganic oxide dispersion is used.

Sealing Method

A resin composition as a mixture of an inorganic oxide and a resin is prepared by mixing the above transparent inorganic oxide dispersion with a monomer or an oligomer of a resin using a mixer, pressure-kneading the mixture using a kneader such as an extruder, a heating roller, or a heating kneader, and cooling and grinding the kneaded mixture.

The resin composition is applied so as to coat the LED chip 1 and the lead frame 2, and then the coating film is cured by heating.

Thus, the LED chip 1 and the lead frame 2 can be sealed with the sealing material 4 composed of the inorganic oxide particle-containing resin composition in which inorganic oxide particles having a disperse particle diameter of 1 nm or more and 20 nm or less and a refractive index of 1.8 or more are dispersed in the transparent silicone resin.

After sealing, the metal case 5 is mounted so as to cover the LED chip 1, the lead frame 2 and the sealing material 4, and then the external terminal 3 is insulated with the insulating material 6.

Thus, a light emitting diode of the present embodiment shown in FIG. 2 can be produced.

When the light emitting diode is applied to an optical semiconductor device such as an optical pickup used in a CD, a CD-ROM, a CD-Video, an MO, a CD-R, and a DVD, performances suited for use as an apparatus can be improved and reliability of an optical component can be improved for a long period.

As described above, according to the light emitting diode of the present embodiment, the light transmittance, the refractive index, thermostability, hardness and weatherability can be improved since an inorganic oxide particle-containing resin composition in which inorganic oxide particles having a disperse particle diameter of 1 nm or more and 20 nm or less and a refractive index of 1.8 or more are dispersed in a transparent silicone resin is used as the sealing material 4 which exerts both a protective function and a lens function. Therefore, light extraction efficiency can be improved and luminescent brightness can be improved.

According to the method for producing a light emitting diode of the present embodiment, a light emitting diode having improved light transmittance, refractive index, thermostability, hardness and weatherability, improved light extraction efficiency and improved luminescent brightness can be easily produced since the above transparent inorganic oxide dispersion is mixed with a monomer or an oligomer of a resin and pressure-kneaded, and then the kneaded mixture is cooled and ground to prepare a resin composition as a mixture of an inorganic oxide and a resin, and then the resin composition is applied so as to coat the LED chip 1 and the lead frame 2 and the coating film is cured.

Examples

The present invention will be described below by way of Examples using zirconia particles as inorganic oxide particles having a disperse particle diameter of 1 nm or more and 20 nm or less and a refractive index of 1.8 or more and Comparative Examples, but the present invention is not limited to the following Examples.

A. Preparation of Inorganic Oxide Particle-Containing Resin Composition (Transparent Composite)

Example 12

Preparation of Transparent Inorganic Oxide Dispersion (Transparent Zirconia Dispersion)

In the same manner as in Example 1, particles were synthesized to produce zirconia particles.

To 10 g of the zirconia particles, 85 g of methyl ethyl ketone as a disperse medium and 5 g of a silane coupling agent KBM-3103 (manufactured by Shin-Etsu Chemical Co., Ltd.) as a surface modifier were added, followed by mixing, thereby modifying the surface of the zirconia particles with the silane coupling agent. Then, a dispersion treatment was carried out to prepare a transparent inorganic oxide dispersion (Z12) in which the disperse particle diameter is 1 nm or more and 20 nm or less.

(Preparation of Sealing Material)

To 100 g of the transparent inorganic oxide dispersion (Z12), 9 g of methylvinylsilicone (average content of a vinyl group: 3 mol %) and 1 g of methylhydrodienesilicone (average content of a vinyl group: 30 mol %) were added and also chloroplatinic acid was added in an amount of 20 ppm based on 100 parts by weight of silicone oil, followed by removal of the solvent through vacuum drying to prepare a resin composition.

The resin composition was poured into a mold assembled using a glass plate in a thickness of 1 mm and then cured by heating at 150° C. for 2 hours to prepare an inorganic oxide particle-containing resin composition of Example 12. The content of zirconia of the inorganic oxide particle-containing resin composition was 50% by weight.

Comparative Example 25

Using a silica sol MEK-ST (manufactured by NISSAN CHEMICAL INDUSTRIES, LTD.) as inorganic oxide particles, the silica sol was diluted with methyl ethyl ketone, thereby adjusting the concentration of silica to 10% by weight to prepare a silica dispersion (S1) of Comparative Example 25.

The average disperse particle diameter of silica particles in the silica dispersion (S1) was 15 nm.

To the silica dispersion, methylvinylsilicone used in Example 12, methylhydrodienesilicone and chloroplatinic acid were added, followed by removal of the solvent through vacuum drying to prepare a resin composition. The content of silica particles in the resin composition was adjusted to 50% by weight.

In the same manner as in Example 12, the resin composition was treated to prepare an inorganic oxide particle-containing resin composition of Comparative Example 25.

Comparative Example 26

In the same manner as in Example 12, except that zirconia particles RC-100 (manufactured by DAIICHI KIGENSO KAGAKU KOGYO CO., LTD.) were used as inorganic oxide particles, a dispersion treatment was carried out to prepare a zirconia dispersion (Z13) of Comparative Example 26. The average disperse particle diameter of zirconia particles in the zirconia dispersion (Z13) was 10 nm.

To the zirconia dispersion, methylvinylsilicone used in Example 12, methylhydrodienesilicone and chloroplatinic acid were added, followed by removal of the solvent through vacuum drying to prepare a resin composition. The content of zirconia particles in the resin composition was adjusted to 50% by weight.

In the same manner as in Example 12, the resin composition was treated to prepare an inorganic oxide particle-containing resin composition of Comparative Example 26.

Comparative Example 27

In the same manner as in Comparative Example 26, a resin composition was prepared. The content of the zirconia particles in the resin composition was adjusted to 2% by weight.

In the same manner as in Example 12, the resin composition was treated to prepare an inorganic oxide particle-containing resin composition of Comparative Example 27.

Evaluation of Inorganic Oxide Particle-Containing Resin Composition

With respect to the inorganic oxide particle-containing resin compositions of Example 12 and Comparative Examples 25 to 27, the three items visible light transmittance, refractive index and hardness were evaluated by the following apparatuses and procedures.

(1) Visible Light Transmittance

Using a spectrophotometer (manufactured by JASCO Corporation), light transmittance of visible light was measured. A bulk material measuring 100×100×1 mm was used as a measuring sample. Samples having a light transmittance of 80% or more were rated "Good", whereas, samples having a light transmittance of less than 80% were rated "Poor".

(2) Refractive Index

In accordance with Japanese Industrial Standard: JIS K 7142 "Method for Measurement of Refractive Index of Plastic", the refractive index was measured by an Abbe refractometer.

Herein, Samples where the refractive index was improved by 1.5 or more were rated "Good", whereas, samples where the refractive index was improved by less than 1.5 were rated "Poor".

(3) Hardness

In accordance with Japanese Industrial Standard: JIS K 7215 "Method for Durometer Hardness Test of Plastic", JIS-A hardness was measured using a durometer.

The hardness of each inorganic oxide particle-containing resin composition containing 50% by weight of zirconia prepared by the resin composition of Comparative Example 26 using the zirconia dispersion (Z13) was used as a standard. Samples having a hardness higher than the standard value were rated "Good", whereas, samples having a hardness lower than the standard value were rated "Poor".

The above evaluation results are shown in Table 6.

TABLE 6

| | Inorganic oxide particles | | Dispersion | | Visible light | | | |
| --- | --- | --- | --- | --- | --- | --- | --- | --- |
| | Kind | Content (% by weight) | Kind | Disperse particle diameter (nm) | Resin | transmittance (%) | Refractive index | Hardness |
| Example 12 | Zirconia | 50 | Z12 | 8 | Silicone | Good | Good | Good |
| Comparative Example 25 | Silica | 50 | S1 | 10 | Silicone | Good | Poor | Good |
| Comparative Example 26 | Zirconia | 50 | Z13 | 100 | Silicone | Poor | Good | Standard |
| Comparative Example 27 | Zirconia | 2 | Z13 | 100 | Silicone | Good | Poor | Poor |

(Note)
Z12: Transparent zirconia dispersion
S1: Silica sol
Z13: Zirconia dispersion As is apparent from these evaluation results, all of visible light transmittance, refractive index and hardness are excellent in the inorganic oxide particle-containing resin composition of Example 12.

In the inorganic oxide particle-containing resin composition Comparative Examples 25 to 27, any one or more characteristics of visible light transmittance, refractive index and hardness was inferior as compared with Example 12.

B. Production of Light Emitting Diode

Example 13

A LED chip and a lead frame were sealed using the resin composition of Example 12 and the resin composition was cured in the same manner as in Example 12 to produce a light emitting diode of Example 13.

Comparative Example 28

A LED chip and a lead frame were sealed using the resin composition of Comparative Example 25 and the resin composition was cured in the same manner as in Example 12 to produce a light emitting diode of Comparative Example 28.

Comparative Example 29

A LED chip and a lead frame were sealed using the resin composition of Comparative Example 26 and the resin composition was cured in the same manner as in Example 13 to produce a light emitting diode of Comparative Example 29.

Comparative Example 30

A LED chip and a lead frame were sealed using the resin composition of Comparative Example 27 and the resin composition was cured in the same manner as in Example 13 to produce a light emitting diode of Comparative Example 30.

Evaluation of Light Emitting Diode

With respect to the light emitting diodes of Example 13 and Comparative Examples 28 to 30, the optical output was measured when a forward current of 20 mA was applied at room temperature.

Herein, the optical output when sealed with a resin containing no zirconia particles was used as a standard optical output. Samples where the optical output was improved by 10% or more were rated "Good", whereas, samples where the optical output was improved by less than 10% were rated "Poor".

The above evaluation results are shown in Table 7.

TABLE 7

| | Content of zirconia particles (% by weight) | Dispersion Kind | Disperse particle diameter (nm) | Resin | Optical output |
|---|---|---|---|---|---|
| Example 13 | 50 | Z12 | 8 | Silicone | Good |
| Comparative Example 28 | 50 | S1 | 10 | Silicone | Poor |
| Comparative Example 29 | 50 | Z13 | 100 | Silicone | Poor |
| Comparative Example 30 | 2 | Z13 | 100 | Silicone | Poor |

(Note)
Z12: Transparent zirconia dispersion
S1: Silica sol
Z13: Zirconia dispersion As is apparent from these evaluation results, the optical output was satisfactorily improved in Example 13.

In Comparative Examples 28 to 30, the improvement in the optical output was inferior as compared with Example 13.

The best mode for carrying out the inorganic oxide particle-containing resin composition of the present invention, the composition for sealing a light emitting element (transparent composite) containing the same, the light emitting element and the optical semiconductor device of the present invention will be described below.

This mode is described in detail for purposes of clarity of understanding of the purport of the invention, and the present invention is not to be limited thereto unless otherwise specified.

The sealing material 4 is a composition for sealing a light emitting element in which zirconia particles having a disperse particle diameter of 1 nm or more and 20 nm or less are dispersed in a transparent resin.

The composition for sealing a light emitting element, which constitutes the sealing material 4, comprises the inorganic oxide particle-containing resin composition of the present invention.

The inorganic oxide particle-containing resin composition of the present invention comprises zirconia particles which have a surface modified with a surface modifier and have a disperse particle diameter of 1 nm or more and 20 nm or less, and a hydrogenated epoxy resin obtained by hydrogenating an aromatic ring.

As the zirconia particles having a surface modified with the surface modifier, either monoclinic zirconia particles or tetragonal zirconia particles, or monoclinic zirconia particles and tetragonal zirconia particles are used, but tetragonal zirconia particles are preferred for the following reasons.

Tetragonal zirconia particles are preferred as zirconia particles for the following reasons. In view of synthesis of fine particles, when the particle diameter of fine particles becomes smaller as 20 nm or less, a tetragon becomes more stable than a conventionally known monocline and has high hardness, and also mechanical characteristics of the inorganic oxide particle-containing resin composition can be improved. This resin composite shows high tenacity through volume expansion called martensitic transformation as compared with the case of adding monoclinic zirconia particles.

The disperse particle diameter of zirconia particles is limited to 1 nm or more and 20 nm or less for the following reasons. When the disperse particle diameter is less than 1 nm, crystallinity deteriorates and it becomes difficult to exhibit particle characteristics such as refractive index. In contrast, when the disperse particle diameter is more than 20 nm, transparency deteriorates when formed into a dispersion or a resin composite.

As described above, less light scattering occurs and transparency of the composite can be maintained even in the case of a resin composite composited with a resin since the zirconia particles are nanometer-sized particles.

In the zirconia-containing epoxy resin of the present invention, the content of the zirconia particles is preferably 10% by weight or more and 60% by weight or less, and more preferably 15% by weight or more and 50% by weight or less.

When the content of the zirconia particles is less than 10% by weight, the refractive index of an epoxy resin does not sufficiently increase and, when used in an LED, luminous efficacy of the LED cannot be improved and also mechanical characteristics cannot be improved. In contrast, when the content of the zirconia particles is more than 60% by weight, the epoxy resin itself becomes brittle.

Examples of the hydrogenated epoxy resin include hydrogenated epoxy resins obtained by directly hydrogenating an aromatic ring of an aromatic epoxy resin, for example, a biphenol type epoxy resin such as a bisphenol A type epoxy resin, a bisphenol F type epoxy resin, a 3,3',5,5'-tetramethyl-4,4'-biphenol type epoxy resin, or a 4,4'-biphenol type epoxy resin; a phenol novolak type epoxy resin; a cresol novolak type epoxy resin; a bisphenol A type novolak type epoxy resin; a naphthalenediol type epoxy resin; a trisphenylolmethane type epoxy resin; a tetrakisphenylolethane type epoxy resin; and a phenoldicyclopentadienenovolak type epoxy resin.

Of these hydrogenated epoxy resins, a hydrogenated epoxy resin obtained by directly hydrogenating an aromatic ring of a bisphenol A type epoxy resin, a bisphenol F type epoxy resin or a biphenol type epoxy resin is particularly preferred since it has a high hydrogenation rate.

In the inorganic oxide particle-containing resin composition, an acid anhydride curing agent is used as a curing agent.

Examples of the acid anhydride curing agent include glutaric anhydride, 2-methylglutaric anhydride, 2,2-dimethylglutaric anhydride, 2,2-dimethylglutaric anhydride, 2,4-dimethylglutaric anhydride, 2,2-diethylglutaric anhydride, 2,4-diethylglutaric anhydride, 2-propylglutaric anhydride, and 2-butylglutaric anhydride.

The amount of the acid anhydride curing agent to be added is preferably 20 parts by weight or more and 100 parts by weight or less, and more preferably 40 parts by weight or more and 80 parts by weight or less, when the total amount of the surface modifier and the hydrogenated epoxy resin is 100 parts by weight.

As long as the characteristics are not impaired, curing accelerators and antioxidants may be added to the above inorganic oxide particle-containing resin composition.

Examples of the curing accelerator include tertiary amines and salts thereof, imidazoles and salts thereof, organic phosphines, zinc octylate, and tin octylate. Of these curing accelerators, organic phosphines are particularly preferred.

The amount of the curing accelerator to be added is preferably 0.01 parts by weight or more and 10 parts by weight or less, and more preferably 0.05 parts by weight or more and 5 parts by weight or less, based on 100 parts by weight of the acid anhydride curing agent.

Examples of the antioxidant include monophenols, bisphenols, polymer type phenols, sulfur-based antioxidants, and phosphorous-based antioxidants.

Examples of the monophenols include 2,6-di-t-butyl-p-cresol, butylated hydroxyanisole, 2,6-di-t-butyl-p-ethylphenol, and stearyl-p-(3,5-di-t-butyl-4-hydroxyphenyl)propionate.

Examples of the bisphenols include 2,2'-methylenebis(4-methyl-6-t-butylphenol), 2,2'-methylenebis(4-ethyl-6-t-butylphenol), 4,4'-thiobis(3-methyl-6-t-butylphenol), 4,4'-butylidenebis(3-methyl-6-t-butylphenol), and 3,9-bis[1,1-dimethyl-2-{β-(3-t-butyl-4-hydroxy-5-methylphenyl) propionyloxy}ethyl]2,4,8,10-tetraoxaspiro[5,5]undecane.

Examples of the polymer type phenols include 1,1,3-tris (2-methyl-4-hydroxy-5-t-butyl-phenyl)butane, 1,3,5-trimethyl-2,4,6-tris(3,5-di-t-butyl-4-hydroxybenzyl)benzene, tetrakis-[methylene-3-(3',5'-di-t-butyl-4'-hydroxyphenyl) propionate]methane, bis[3,3'-bis(4'-hydroxy-3'-t-butyl-phenyl)butyric acid]glycol ester, 1,3,5-tris(3',5'-di-t-butyl-4'-hydroxybenzyl)-S-triazine-2,4,6-(1H,3H,5H)trione, and tocophenol.

Examples of the sulfur-based antioxidants include dilauryl-3,3'-thiodipropionate, dimyristyl-3,3'-thiodipropionate, and distearyl-3,3'-thiodipropionate.

Examples of the phosphorus-based antioxidants include phosphites and oxaphosphaphenanthrene oxides.

Examples of the phosphites include triphenyl phosphite, diphenylisodecyl phosphite, phenyldiisodecyl phosphite, tris(nonylphenyl)phosphite, diisodecylpentaerythritol phosphite, tris(2,4-di-t-butyl-phenyl)phosphite, cyclic neopentanetetraylbis(octadecyl)phosphite, cyclic neopentanetetraylbis(2,4-di-t-butyl-phenyl)phosphite, cyclic neopentanetetraylbis(2,4-di-t-butyl-4-methylphenyl)phosphite, and bis[2-t-butyl-6-methyl-4-{2-(octadecyloxycarbonyl)ethyl}phenyl]hydrogen phosphite.

Examples of the oxaphosphaphenanthrene oxides include 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, and 10-decyloxy-9,10-dihydro-9-oxa-10-phosphaphenanthrene-10-oxide.

While these antioxidants can be used alone, it is particularly preferred to use in combination with phenolic/sulfur-based antioxidants or phenolic/phosphorous-based antioxidants.

The amount of the antioxidant to be added is preferably 0.01 parts by weight or more and 10 parts by weight or less, and more preferably 0.05 parts by weight or more and 5 parts by weight or less, when the total amount of the surface modifier and the hydrogenated epoxy resin is 100 parts by weight.

The method for preparing this inorganic oxide particle-containing resin composition (zirconia-containing epoxy resin composition) will be described below.

First, diluted ammonia water is added to a zirconium salt solution containing a zirconium salt such as zirconium oxychloride octahydrate in pure water while stirring to prepare a zirconia precursor slurry.

To the slurry, an aqueous solution of an inorganic salt such as sodium sulfate is added while stirring. The amount of the inorganic salt to be added is from 20 to 40% by weight based on zirconia ions as zirconia in the zirconium salt solution.

The mixture is dried in atmospheric air at 100 to 150° C. for 24 to 36 hours using a dryer to obtain a solid matter.

The solid matter is ground by an automatic mortar and then calcined in atmospheric air at 500° C. for 1 to 5 hours using an electric furnace.

The calcined material is poured into pure water, followed by stirring to form a slurry, which is washed using a centrifuge. After the inorganic salt added is sufficiently removed, the residue is dried by a dryer to produce zirconia particles.

To the zirconia particles, an organic solvent as a disperse medium and a surface modifier are added, followed by mixing. Then, a dispersion treatment is carried out by a wet mixer such as a beads mill using zirconia beads in size of 0.05 to 1 mmφ and, at the same time, the surface of zirconia particles is modified with a surface modifier to prepare a zirconia dispersion.

To the zirconia dispersion, a hydrogenated epoxy resin obtained by directly hydrogenating a bisphenol A type epoxy resin, a curing agent and a curing accelerator are added, followed by removal of the solvent through vacuum drying to prepare an inorganic oxide particle-containing resin composition.

The composition for sealing a light emitting element of the present invention comprises an inorganic oxide particle-containing resin composition, the inorganic oxide particle-containing resin composition being cured.

In the composition for sealing a light emitting element, the content of the zirconia particles is 10% by weight or more and 60% by weight or less, and the light transmittance of light having a wavelength of 350 nm or more and 800 nm or less is 80% or more.

The light transmittance varies depending on the content of the zirconia particles in the composition for sealing a light emitting element, and the light transmittance is 90% or more when the content of the zirconia particles is 1% by weight, and is 80% or more when the content of the zirconia particles is 40% by weight.

When tetragonal zirconia particles are used as zirconia particles, the refractive index of the composition for sealing a light emitting element can be further increased by dispersing tetragonal zirconia particles in a hydrogenated epoxy resin constituting the composition for sealing a light emitting element as compared with the refractive index of about 1.5 of the epoxy resin since the refractive index of the tetragonal zirconia particles is 2.15.

An improvement in tenacity through martensitic transformation can be expected for the tetragonal zirconia particles as compared with the monoclinic zirconia particles. Moreover, the tetragonal zirconia particles are suited for improvement of mechanical characteristics of the composition for sealing a light emitting element since the tetragonal zirconia particles have high tenacity and hardness.

Less light scattering occurs and transparency of the composite material can be maintained even when composited with the resin since the tetragonal zirconia particles are nanometer-sized particles.

In the light emitting diode shown in FIG. 2, the region from the LED chip 1 to the aperture portion 7 of the metal case 5 is a transmitting region of light emitted from the LED chip 1, and the light transmitting region is sealed with the sealing material 4 composed of a composition for sealing a light emitting element in which zirconia particles having a disperse particle diameter of 1 nm or more and 20 nm or less are dispersed in an epoxy resin. Therefore, the light transmitting region has a high light transmittance, a high refractive index, high thermostability, high hardness, and excellent weatherability.

Therefore, light extraction efficiency of the light emitting diode is improved and thus luminescent brightness is improved The method for producing this light emitting diode will be described below.

First, the LED chip 1 is loaded at a predetermined position of the lead frame 2 and the LED chip 1 is electrically connected with the lead frame 2 using wire bonding (not shown). Then, the unnecessary portion of the lead of the lead frame 2 is cut and the remaining lead is bent to obtain the external terminal 3.

Next, the LED chip 1 and the lead frame 2 are sealed with the sealing material 4 composed of a composition for sealing a light emitting element in which zirconia particles having a disperse particle diameter of 1 nm or more and 20 nm or less are dispersed in a transparent hydrogenated epoxy resin.

When the composition for sealing a light emitting element constituting the sealing material 4 is prepared, the above inorganic oxide particle-containing resin composition is used.

The inorganic oxide particle-containing resin composition is applied so as to coat the LED chip 1 and the lead frame 2, and then the coating film is cured by heating or irradiating with ultraviolet light or infrared light.

Thus, the LED chip 1 and the lead frame 2 can be sealed with a sealing material 4 composed of a composition for sealing a light emitting element in which zirconia particles having a disperse particle diameter of 1 nm or more and 20 nm or less are dispersed in a transparent hydrogenated epoxy resin.

After sealing, the metal case 5 is mounted so as to cover the LED chip 1, the lead frame 2 and the sealing material 4, and then the external terminal 3 is insulated with the insulating material 6.

Thus, a light emitting diode of the present embodiment shown in FIG. 2 can be produced.

When the light emitting diode is applied to an optical semiconductor device such as an optical pickup used in a CD, a CD-ROM, a CD-Video, an MO, a CD-R, and a DVD, performances suited for use as an apparatus can be improved and reliability of an optical component can be improved for a long period.

As described above, according to the light emitting diode of the present embodiment, the light transmittance, the refractive index, thermostability, hardness and weatherability can be improved since the sealing material 4 composed of a composition for sealing a light emitting element in which zirconia particles having a disperse particle diameter of 1 nm or more and 20 nm or less are dispersed in a transparent hydrogenated epoxy resin is used as a sealing material 4 which exerts both a protective function and a lens function.

Therefore, light extraction efficiency can be improved and luminescent brightness can be improved.

According to the method for producing a light emitting diode of the present embodiment, a light emitting diode having improved light transmittance, refractive index, thermostability, hardness and weatherability, improved light extraction efficiency and improved luminescent brightness can be easily produced since the above inorganic oxide particle-containing resin composition is applied so as to coat the LED chip 1 and the lead frame 2 and the coating film is cured.

Examples

The present invention will now be described in detail below by way of Examples and Comparative Examples, but the present invention is not limited to the following Examples.

Example 14

Preparation of Tetragonal Zirconia Dispersion

In the same manner as in Example 1, particles were synthesized to produce zirconia particles.

The crystal system of zirconia particles was examined using an X-ray diffractometer. As a result, an X-ray diffraction pattern (chart) shown in FIG. 1 revealed that the crystal system of zirconia particles is a tetragonal system.

To 10 g of the tetragonal zirconia particles, 80 g of toluene as a disperse medium and 10 g of a "silane coupling agent system" (KBM-503, manufactured by Shin-Etsu Chemical Co., Ltd.) as a surface modifier were added, followed by mixing. Then, a dispersion treatment was carried out by a beads mill using zirconia beads having a $\phi$ of 0.1 mm to prepare a tetragonal zirconia dispersion.

The disperse particle diameter of the tetragonal zirconia particles of the tetragonal zirconia dispersion was measured using a dynamic light scattering type particle size distribution analyzer (manufactured by Malvern Co.). As a result, it was 10 nm.

(Preparation of Inorganic Oxide Particle-Containing Resin Composition (Zirconia-Containing Epoxy Resin Composition)

To 100 g of the tetragonal zirconia dispersion, 6 g of an epoxy resin Epicoat YX8000 (hydrogenation rate: 100%, manufactured by Japan Epoxy Resins Co., Ltd.) as a hydrogenated epoxy resin obtained by directly hydrogenating a bisphenol A type epoxy resin, 3.7 g of glutaric anhydride (manufactured by Tokyo Chemical Industry Co., Ltd.) as a curing agent, 0.15 g of Hishicoline PX-4ET (manufactured by Nippon Chemical Industrial Co., Ltd.) as a curing accelerator and 0.15 g of 2,6-di-t-butyl-p-cresol (manufactured by Kanto Chemical Co., Inc.) as an antioxidant were added, followed by removal of the solvent through vacuum drying to prepare an inorganic oxide particle-containing resin composition.

The inorganic oxide particle-containing resin composition was poured into a mold assembled using a glass plate in a thickness of 1 mm and then cured by heating at 100° C. for 30 minutes, then at 140° C. for 3 hours to produce a zirconia-containing epoxy resin composite. The content of tetragonal zirconia particles of the zirconia-containing epoxy resin composite was 50% by weight.

Example 15

In the same manner as in Example 14, tetragonal zirconia particles were prepared.

To 10 g of the tetragonal zirconia particles, 80 g of toluene as a disperse medium and 10 g of a "silane coupling agent system" (A-1504, manufactured by Tokyo Chemical Industry Co., Ltd.) as a surface modifier were added, followed by mixing. Then, a dispersion treatment was carried out by a beads mill using zirconia beads having a $\phi$ of 0.1 mm to prepare a tetragonal zirconia dispersion.

The disperse particle diameter of the tetragonal zirconia particles of the tetragonal zirconia dispersion was measured using a dynamic light scattering type particle size distribution analyzer (manufactured by Malvern Co.). As a result, it was 10 nm.

Using 100 g of the tetragonal zirconia dispersion, an inorganic oxide particle-containing resin composition was prepared in the same manner as in Example 14.

Using the inorganic oxide particle-containing resin composition, a zirconia-containing epoxy resin composite was prepared in the same manner as in Example 14. The content of the tetragonal zirconia particles of the zirconia-containing epoxy resin composite was 50% by weight.

Example 16

In the same manner as in Example 14, tetragonal zirconia particles were prepared.

To 10 g of the tetragonal zirconia particles, 80 g of toluene as a disperse medium and 10 g of a "silicone resin system" (KR-213, manufactured by Shin-Etsu Chemical Co., Ltd.) as a surface modifier were added, followed by mixing. Then, a dispersion treatment was carried out by a beads mill using zirconia beads having a φ of 0.1 mm to prepare a tetragonal zirconia dispersion.

The disperse particle diameter of the tetragonal zirconia particles of the tetragonal zirconia dispersion was measured using a dynamic light scattering type particle size distribution analyzer (manufactured by Malvern Co.). As a result, it was 10 nm.

Using 100 g of the tetragonal zirconia dispersion, an inorganic oxide particle-containing resin composition was prepared in the same manner as in Example 14.

Using the inorganic oxide particle-containing resin composition, a zirconia-containing epoxy resin composite was prepared in the same manner as in Example 14. The content of the tetragonal zirconia particles of the zirconia-containing epoxy resin composite was 50% by weight.

Comparative Example 31

In the same manner as in Example 14, tetragonal zirconia particles were prepared.

To 10 g of the tetragonal zirconia particles, 80 g of toluene as a disperse medium and 10 g of a "silicone resin system" (KBM-503, manufactured by Shin-Etsu Chemical Co., Ltd.) as a surface modifier were added, followed by mixing. Then, a dispersion treatment was carried out by a beads mill using zirconia beads having a φ of 0.1 mm to prepare a tetragonal zirconia dispersion.

The disperse particle diameter of the tetragonal zirconia particles of the tetragonal zirconia dispersion was measured using a dynamic light scattering type particle size distribution analyzer (manufactured by Malvern Co.). As a result, it was 10 nm.

To 100 g of the tetragonal zirconia dispersion, 7 g of a bisphenol A type epoxy resin (epoxy resin Epicoat 828, manufactured by Japan Epoxy Resins Co., Ltd.) and 3 g of a curing agent (Epicure 3080, manufactured by Japan Epoxy Resins Co., Ltd.) were added, followed by removal of the solvent through vacuum drying to prepare an inorganic oxide particle-containing resin composition.

The inorganic oxide particle-containing resin composition was poured into a mold assembled using a glass plate in a thickness of 1 mm and then cured by heating at 100° C. for 30 minutes, then at 140° C. for 3 hours to produce a zirconia-containing epoxy resin composite. The content of tetragonal zirconia particles of the zirconia-containing epoxy resin composite was 50% by weight.

Comparative Example 32

In the same manner as in Example 14, tetragonal zirconia particles were prepared.

To 10 g of the tetragonal zirconia particles, 90 g of a toluene as a disperse medium was added, followed by mixing. Then, a dispersion treatment was carried out by a beads mill using zirconia beads having a φ of 0.1 mm.

After the dispersion treatment, a treating solution caused white turbidity and the zirconia particles were sedimented.

Comparative Example 33

RC-100 (manufactured by DAIICHI KIGENSO KAGAKU KOGYO CO., LTD.) containing monoclinic and tetragonal zirconia particles was used as zirconia particles.

To 10 g of the tetragonal zirconia particles, 80 g of toluene as a disperse medium and 10 g of a "silane coupling agent system" (A-1504, manufactured by Tokyo Chemical Industry Co., Ltd.) as a surface modifier were added, followed by mixing. Then, a dispersion treatment was carried out by a beads mill using zirconia beads having a φ of 0.1 mm to prepare a zirconia dispersion.

The disperse particle diameter of the zirconia particles of the zirconia dispersion was measured using a dynamic light scattering type particle size distribution analyzer (manufactured by Malvern Co.). As a result, it was 100 nm.

Using 100 g of the zirconia dispersion, an inorganic oxide particle-containing resin composition was prepared in the same manner as in Example 14.

Using the inorganic oxide particle-containing resin composition, a zirconia-containing epoxy resin composite was prepared in the same manner as in Example 14. The content of zirconia particles of the zirconia-containing epoxy resin composite was 50% by weight.

Comparative Example 34

RC-100 (manufactured by DAIICHI KIGENSO KAGAKU KOGYO CO., LTD.) containing monoclinic and tetragonal zirconia particles was used as zirconia particles.

To 10 g of the tetragonal zirconia particles, 80 g of toluene as a disperse medium and 10 g of a "silane coupling agent system" (KBM-503, manufactured by Shin-Etsu Chemical Co., Ltd.) as a surface modifier were added, followed by mixing. Then, a dispersion treatment was carried out by a beads mill using zirconia beads having a φ of 0.1 mm to prepare a zirconia dispersion.

The disperse particle diameter of the zirconia particles of the zirconia dispersion was measured using a dynamic light scattering type particle size distribution analyzer (manufactured by Malvern Co.). As a result, it was 100 nm.

To 100 g of the tetragonal zirconia dispersion, 7 g of a bisphenol A type epoxy resin (epoxy resin Epicoat 828, manufactured by Japan Epoxy Resins Co., Ltd.) and 3 g of a curing agent (Epicure 3080, manufactured by Japan Epoxy Resins Co., Ltd.) were added, followed by removal of the solvent through vacuum drying to prepare an inorganic oxide particle-containing resin composition.

The inorganic oxide particle-containing resin composition was poured into a mold assembled using a glass plate in a thickness of 1 mm and then cured by heating at 100° C. for 30 minutes, then at 140° C. for 3 hours to prepare a zirconia-containing epoxy resin composite. The content of zirconia particles of the zirconia-containing epoxy resin composite was 50% by weight.

Comparative Example 35

In the same manner as in Example 14, tetragonal zirconia particles were prepared.

To 10 g of the tetragonal zirconia particles, 80 g of toluene as a disperse medium and 10 g of a silane coupling agent system (KBM-503, manufactured by Shin-Etsu Chemical Co., Ltd.) as a surface modifier were added, followed by mixing. Then, a dispersion treatment was carried out by a beads mill using zirconia beads having a φ of 0.1 mm to prepare a tetragonal zirconia dispersion.

The disperse particle diameter of the tetragonal zirconia particles of the zirconia dispersion was measured using a dynamic light scattering type particle size distribution analyzer (manufactured by Malvern Co.). As a result, it was 100 nm.

To 10 g of the tetragonal zirconia dispersion, 6 g of epoxy a resin Epicoat YX8000 (hydrogenation rate: 100%, manufactured by Japan Epoxy Resins Co., Ltd.) as a hydrogenated epoxy resin obtained by directly hydrogenating a bisphenol A type epoxy resin, 3.7 g of glutaric anhydride (manufactured by Tokyo Chemical Industry Co., Ltd.) as a curing agent, 0.15 g of Hishicoline PX-4ET (manufactured by Nippon Chemical Industrial Co., Ltd.) as a curing accelerator and 0.15 g of 2,6-di-t-butyl-p-cresol (manufactured by Kanto Chemical Co., Inc.) as an antioxidant were added, followed by removal of the solvent through vacuum drying to prepare an inorganic oxide particle-containing resin composition.

The inorganic oxide particle-containing resin composition was poured into a mold assembled using a glass plate in a thickness of 1 mm and then cured by heating at 100° C. for 30 minutes, then at 140° C. for 3 hours to produce a zirconia-containing epoxy resin composite. The content of zirconia particles of the zirconia-containing epoxy resin composite was 50% by weight.

Evaluation of Zirconia-Containing Epoxy Resin Composite

With respect to the zirconia-containing epoxy resin composites of Examples 14 to 16 and Comparative Examples 31 to 35, the three items visible light transmittance, haze and refractive index were evaluated by the following apparatuses and procedures.

(1) Visible Light Transmittance

Using a spectrophotometer V-570 (manufactured by JASCO Corporation), the light transmittance of light having a wavelength of 350 to 800 nm was measured. A light transmittance of light having a wavelength of 350 to 800 nm in air was set to 100%.

A bulk material measuring 100×100×1 mm was used as a measuring sample.

(2) Haze

In accordance with Japanese Industrial Standard: JIS K 7136 "Method for Determination of Plastic-Transparent Material", the haze value was measured using a haze mater (NDH-2000, manufactured by Nippon Denshoku Industries Co., Ltd.). The haze value of air was set to 0%.

(3) Refractive Index

In accordance with Japanese Industrial Standard: JIS K 7142 "Method for Measurement of Refractive Index of Plastic", the refractive index was measured using an Abbe refractometer.

Herein, a resin containing no zirconia added therein was used as a standard sample. Samples where the refractive index was improved by 0.05 or more were rated "Good", whereas, samples where the refractive index was improved by less than 0.05 were rated "Poor".

As a resin which is a standard for evaluation of the refractive index, a resin obtained by curing an epoxy resin composition comprising 10 g of a bisphenol A type epoxy resin (epoxy resin Epicoat 828, manufactured by Japan Epoxy Resins Co., Ltd.) and 7 g of a curing agent (Epicure 3080, manufactured by Japan Epoxy Resins Co., Ltd.) was used. The visible light transmittance of the resin was 75% and a haze value was 0.20%.

The visible light transmittance of a resin obtained by curing an epoxy resin composition comprising 10 g of a hydrogenated epoxy resin obtained by directly hydrogenating a bisphenol A type epoxy resin (hydrogenation rate: 100%, epoxy resin Epicoat YX8000, manufactured by Japan Epoxy Resins Co., Ltd.), 7 g of glutaric anhydride (manufactured by Tokyo Chemical Industry Co., Ltd.) as a curing agent, 0.1 g of a curing accelerator (Hishicoline PX-4ET, manufactured by Nippon Chemical Industrial Co., Ltd.) and 0.1 g of 2,6-di-t-butyl-p-cresol (manufactured by Kanto Chemical Co., Inc.) as an antioxidant was 85% and the haze value was 0.20%.

The above evaluation results are shown in Table 8.

TABLE 8

| | Epoxy resin | Disperse particle diameter of zirconia particles (nm) | Content of zirconia particles (% by weight) | Visible light transmittance (%) | Haze value (%) | Refractive index | Surface treatment |
| --- | --- | --- | --- | --- | --- | --- | --- |
| Example 14 | Hydrogenated epoxy resin | 10 | 50 | 80 | 0.50 | Good | Performed |
| Example 15 | Hydrogenated epoxy resin | 10 | 50 | 80 | 0.50 | Good | Performed |
| Example 16 | Hydrogenated epoxy resin | 10 | 50 | 80 | 0.50 | Good | Performed |
| Comparative Example 31 | Aromatic epoxy resin | 10 | 50 | 72 | 0.50 | Good | Performed |
| Comparative Example 32 | Hydrogenated epoxy resin | — | — | Impossible to measure | — | — | Not performed |
| Comparative Example 33 | Hydrogenated epoxy resin | 100 | 50 | 5 | 50 | Good | Performed |
| Comparative Example 34 | Aromatic epoxy resin | 100 | 50 | 5 | 50 | Good | Performed |
| Comparative Example 35 | Hydrogenated epoxy resin | 10 | 5 | 83 | 0.30 | Poor | Performed |

As is apparent from these evaluation results, the zirconia-containing epoxy resin composites of Examples 14 to 16 are excellent in visible light transmittance, haze and refractive index.

In the zirconia-containing epoxy resin composites of Comparative Example 31 to 35, any one characteristic of visible light transmittance, haze and a refractive index was inferior as compared with Examples 14 to 16.

The best mode for carrying out the inorganic oxide particle-containing transparent plastic member and the composite plastic member of the present invention will be described below.

This mode is described in detail for purposes of clarity of understanding of the purport of the invention, and the present invention is not to be limited thereto unless otherwise specified.

Inorganic Oxide Particle-Containing Transparent Plastic Member

The inorganic oxide particle-containing transparent plastic member of the present invention is a film- or sheet-like transparent plastic member comprising fine zirconia particles which have a surface modified with a surface modifier and have a disperse particle diameter of 1 nm or more and 20 nm or less.

The transparent plastic member is in the form of a film or sheet having a thickness of 10 μm to 5 mm. Specifically, the transparent plastic member includes those having various thicknesses and shapes, such as a transparent plastic film, a transparent plastic sheet, and a thick transparent plastic substrate, and can be appropriately selected according to application.

It is preferred that the fine zirconia particles are uniformly dispersed in a plastic having transparency to visible light.

The disperse particle diameter of fine zirconia particles is preferably 1 nm or more and 20 nm or less.

The disperse particle diameter of zirconia particles is limited to 1 nm or more and 20 nm or less for the following reasons. When the disperse particle diameter is less than 1 nm, crystallinity deteriorates and it becomes difficult to exhibit particle characteristics such as refractive index. In contrast, when the disperse particle diameter is more than 20 nm, transparency of the plastic member deteriorates.

As described above, less light scattering occurs and transparency can be maintained even when the zirconia particles are dispersed in a plastic member since zirconia particles are nanometer-sized particles.

The surface of the fine zirconia particles is modified with a surface modifier, and the surface modifier is not specifically limited as long as it can hydrophobize hydrophilic zirconia particles and can ensure dispersibility in a plastic to be composited. For example, one or more kinds selected from the group consisting of an alkoxysilane, chlorosilane, an alkylalkoxysilane, an alkylchlorosilane, siloxane, and a surfactant are preferred.

In view of excellent heat resistance, a silane compound such as an alkoxysilane, chlorosilane, an alkylalkoxysilane, an alkylchlorosilane, or siloxane is more preferred.

The plastic may be those having transparency to visible light in the form of a film or sheet having a thickness of 10 μm to 5 mm, and various ones having various shapes such as a film, a sheet, a very thin sheet can be selected and used according application.

Examples of the plastic include polyethylene terephthalate (PET), polycarbonate (PC), polyethersulfone (PES), polyethylene naphthalate (PEN), polyallylate (PAR), aromatic polyetherketone (PEEK), polyolefin, triacetyl cellulose (TAC), an acrylonitrile-styrene copolymer (AS resin), a methyl methacrylate-styrene copolymer (MS resin), and poly-4-methylpentene (TPX).

It is also possible to use a polyester resin, a polyimide resin, an epoxy resin, and a norbornene-based polymer, each having transparency to visible light.

In the inorganic oxide particle-containing transparent plastic member, the content of the fine zirconia particles is preferably 10% by weight or more and 80% by weight or less, and more preferably 20% by weight or more and 80% by weight or less.

The content of the zirconia particles is limited to 10% by weight or more and 80% by weight or less for the following reasons. 10% by weight as the lower limit is the minimum value of the content which enables an improvement in the refractive index of a plastic member to become effective, and it becomes impossible to achieve a high refractive index of the plastic member when the content is less than 10% by weight. 80% by weight as the upper limit is the maximum value of the content which makes it possible to maintain characteristics of the plastic member itself, and characteristics as the plastic member may be lost when the content is more than 80% by weight.

In the inorganic oxide particle-containing transparent plastic member, when the content of the fine zirconia particles is 25% by weight and the light path length is 100 μm, the visible light transmittance is preferably 80% or more, and more preferably 82% or more.

The visible light transmittance varies depending on the content of the fine zirconia particles in the transparent plastic member, and the visible light transmittance is 85% or more when the content of the fine zirconia particles is 10% by weight, and is 80% or more when the content of the fine zirconia particles is 40% by weight.

The refractive index of fine zirconia particles slightly varies depending on a crystal system and is a value larger than 2. Therefore, the refractive index can be increased by dispersing the fine zirconia particles in a plastic.

Less light scattering occurs and transparency can be maintained even when composited with a plastic since the fine zirconia particles are nanometer-sized particles.

Method for Producing Inorganic Oxide Particle-Containing Transparent Plastic Member (Fine Zirconia Transparent Plastic Member)

A thin product such as a transparent plastic film or a transparent plastic sheet is produced by uniformly dispersing fine zirconia particles, which have a surface modified with a surface modifier and have a disperse particle diameter of 1 nm or more and 20 nm or less, in a raw material of a plastic to be composited to obtain a mixture, polymerizing or polycondensing the mixture to prepare a fine zirconia particle-containing plastic composition, and forming the plastic composition into a film or a sheet.

It is also obtained by dispersing fine zirconia particles, which have a surface modified with a surface modifier and have a disperse particle diameter of 1 nm or more and 20 nm or less, in an organic solvent to prepare a fine zirconia particle-containing dispersion, dissolving a raw material of a plastic to be composited in the dispersion to prepare a fine zirconia particle-containing plastic solution, and forming the plastic solution into a film or a sheet using a solution-cast method.

Composite Plastic Member

By forming various films such as an anti-reflective (AR) film, an anti-glare (AG) film, and a hard coat (HC) film on the surface of the inorganic oxide particle-containing transparent plastic member, or laminating various plastic films such as an anti-reflective (AR) film, an anti-glare (AG) film, and a hard coat (HC) film, a composite plastic member having various functions such as an anti-reflective (AR) function, an anti-glare (AG) function, and an anti-scratch function can be obtained.

Examples of the composite plastic member include a functional film and a functional sheet.

Examples

The present invention will now be described in detail below by way of Examples and Comparative Examples, but the present invention is not limited to the following Examples.

Example 17

In the same manner as in Example 1, particles were synthesized to produce fine zirconia particles.
(Formation of Fine Zirconia Particle-Containing Polyethylene Terephthalate Film)

To 45 g of the fine zirconia particles, 50 g of ethylene glycol as a disperse medium and 5 g of dimethyldichlorosilane (manufactured by Shin-Etsu Chemical Co., Ltd.) as a surface modifier were added, followed by mixing. Then, a dispersion treatment was carried out to prepare a transparent inorganic oxide dispersion.

The disperse particle diameter of fine zirconia particles of the transparent inorganic oxide dispersion was measured using a dynamic light scattering type particle size distribution analyzer (manufactured by Malvern Co.). As a result, it was 10 nm.

To 100 parts by weight of the dispersion, 50 parts by weight of dimethyl terephthalate was added and also 0.05 parts by weight of magnesium acetate as a catalyst was added, and then an ester exchange reaction was carried out. Furthermore, 0.02 parts by weight of antimony oxide as a polycondensation catalyst and 0.02 parts by weight of trimethyl phosphate as a heat-resistant stabilizer were added, and then a polycondensation reaction was performed to prepare a polyethylene terephthalate composition containing fine zirconia particles.

The polyethylene terephthalate composition was melt-extruded at 290° C., drawn at 90° C. in a draw ratio of 3 times in a length and a width, and then heat-treated at 220° C. for 15 seconds to form a biaxially drawn fine zirconia particle-containing polyethylene terephthalate film having a thickness of 100 μm.

Example 18

In the same manner as in Example 1, particles were synthesized to produce fine zirconia particles.

To 15 g of the fine zirconia particles, 80 g of methylene chloride as a disperse medium and 5 g of phenyltrichlorosilane (manufactured by Shin-Etsu Chemical Co., Ltd.) as a surface modifier were added, followed by stirring at 7,000 rpm using a homogenizer to prepare a zirconia dispersion.

The disperse particle diameter of fine zirconia particles of the transparent inorganic oxide dispersion was measured using a dynamic light scattering type particle size distribution analyzer (manufactured by Malvern Co.). As a result, it was 8 nm.

To 100 parts by weight of the dispersion, 30 parts by weight of a polycarbonate resin pellet Panlite C-1400QJ (manufactured by TEIJIN CHEMICALS LTD.) was added, followed by stirring to prepare a polycarbonate resin solution containing fine zirconia particles dispersed therein.

The polycarbonate resin solution was filtered to remove foreign matters, cast on a mirror-finished stainless steel belt using a lip die, dried with hot air at 60° C. for 30 minutes, followed by peeling to form a fine zirconia particle-containing polycarbonate film having a thickness of 100 μm.

Example 19

In the same manner as in Example 18, a zirconia dispersion was prepared.

To 100 parts by weight of the zirconia dispersion, 30 parts by weight of a polyethersulfone resin powder Sumicaexcel 5200G (manufactured by Sumitomo Chemical Co., Ltd.) was added, followed by stirring to prepare a polyethersulfone resin solution containing fine zirconia particles dispersed therein. The polyethersulfone resin solution was filtered to remove foreign matters, cast on a mirror-finished stainless steel belt using a lip die, dried with hot air at 60° C. for 30 minutes, followed by peeling to form a zirconia-containing polyethersulfone resin film having a thickness of 100 μm.

Comparative Example 36

In the same manner as in Example 17, except that RC-100 (manufactured by DAIICHI KIGENSO KAGAKU KOGYO CO., LTD.) was used as zirconia particles, a dispersion treatment was carried out to prepare a zirconia dispersion. The disperse particle diameter of zirconia particles in the dispersion was measured. As a result, it was 100 nm.

Using the dispersion, a biaxially drawn zirconia particle-containing polyethylene terephthalate film having a thickness of 100 μm was formed in the same manner as in Example 17.

Comparative Example 37

In the same manner as in Example 18, except that RC-100 (manufactured by DAIICHI KIGENSO KAGAKU KOGYO CO., LTD.) was used as zirconia particles, a dispersion treatment was carried out to prepare a zirconia dispersion. The disperse particle diameter of zirconia particles in the dispersion was measured. As a result, it was 100 nm.

Using the dispersion, a zirconia particle-containing polyethylene terephthalate film having a thickness of 100 μm was formed in the same manner as in Example 18.

Comparative Example 38

In the same manner as in Example 19, except that RC-100 (manufactured by DAIICHI KIGENSO KAGAKU KOGYO CO., LTD.) was used as zirconia particles, a dispersion treatment was carried out to prepare a zirconia dispersion. The disperse particle diameter of zirconia particles in the dispersion was measured. As a result, it was 100 nm.

Using the dispersion, a zirconia particle-containing polyethylene terephthalate film having a thickness of 100 μm was formed in the same manner as in Example 19.

Comparative Example 39

To 10 parts by weight of the zirconia dispersion of Comparative Example 36, 90 parts by weight of ethylene glycol was added, followed by stirring. To the dispersion, 50 parts by weight of dimethyl terephthalate was added and also 0.05 parts by weight of magnesium acetate as a catalyst was added, and then the ester exchange reaction was carried out. Furthermore, 0.02 parts by weight of antimony oxide as a polycondensation catalyst and 0.02 parts by weight of trimethyl phosphate as a heat-resistant stabilizer was added, and then the polycondensation reaction was carried out to prepare a zirconia particle-containing polyethylene terephthalate composition.

Using the polyethylene terephthalate composition, a zirconia particle-containing polyethylene terephthalate film having a thickness of 100 μm was formed in the same manner as in Example 17.

Comparative Example 40

To 10 parts by weight of the zirconia dispersion of Comparative Example 37, 120 parts by weight of methylene chloride was added and also 28 parts by weight of a polycarbonate resin pellet Panlite C-1400QJ (manufactured by TEIJIN CHEMICALS LTD.) was added, followed by stirring to prepare a zirconia particle-containing polycarbonate resin solution.

Using the polycarbonate resin solution, a zirconia particle-containing polyethylene terephthalate film having a thickness of 100 μm was formed in the same manner as in Example 18.

Comparative Example 41

To 10 parts by weight of the zirconia dispersion of Comparative Example 38, 120 parts by weight of methylene chloride was added and 28 parts by weight of a polyethersulfone resin powder was dissolved to prepare a zirconia particle-containing polyethersulfone resin solution.

Using the polycarbonate resin solution, a zirconia particle-containing polyethylene terephthalate film having a thickness of 100 μm was formed in the same manner as in Example 19.

Evaluation of Film

With respect to the films of Examples 17 to 19 and Comparative Examples 36 to 41, the three items visible light transmittance, haze and refractive index were evaluated by the following apparatuses and procedures.

(1) Visible Light Transmittance

Using a spectrophotometer V-570 (manufactured by JASCO Corporation), the light transmittance of light having a wavelength of 350 to 800 nm was measured when the light transmittance in air was set to 100%.

(2) Haze

In accordance with Japanese Industrial Standard: JIS K 7136 "Method for Determination of Plastic-Transparent Material", the haze value was measured using a haze mater (NDH-2000, manufactured by Nippon Denshoku Industries Co., Ltd.) when the haze value of air was set to 0%.

(3) Refractive Index

In accordance with Japanese Industrial Standard: JIS K 7142 "Method for Measurement of Refractive Index of Plastic", the refractive index was measured using an Abbe refractometer.

Herein, a resin containing no zirconia added therein was used as a standard sample. Samples where the refractive index was improved by 0.05 or more were rated "Good", whereas, samples where the refractive index was improved by less than 0.05 were rated "Poor".

The above evaluation results are shown in Table 9.

TABLE 9

| | Kind of resin | Content of zirconia (% by weight) | Visible light transmittance (%) | Haze (%) | Refractive index |
|---|---|---|---|---|---|
| Example 17 | PET | 30 | 87 | 0.5 | Good |
| Example 18 | PC | 30 | 89 | 0.5 | Good |
| Example 19 | PES | 30 | 89 | 0.5 | Good |
| Comparative Example 36 | PET | 30 | 3 | 70 | Good |
| Comparative Example 37 | PC | 30 | 5 | 70 | Good |
| Comparative Example 38 | PES | 30 | 5 | 70 | Good |
| Comparative Example 39 | PET | 3 | 85 | 1 | Poor |
| Comparative Example 40 | PC | 5 | 85 | 1 | Poor |
| Comparative Example 41 | PES | 5 | 85 | 1 | Poor |
| Reference Example 1 | PET | none | 88 | 0.5 | Standard |
| Reference Example 2 | PC | none | 90 | 0.3 | Standard |
| Reference Example 3 | PES | none | 90 | 0.4 | Standard |

(Note)
PET: Polyethylene terephthalate
PC: Polycarbonate
PES: Polyethersulfone

As is apparent from the evaluation results, visible light transmittance, haze and refractive index are excellent in Examples 17 to 19.

In Comparative Examples 36 to 41, any one characteristic of visible light transmittance, haze and refractive index was inferior as compared with Examples 17 to 19.

The best mode for carrying out the hard coat film, the optical functional film, the optical lens and the optical component of the present invention will be described below.

This mode is described in detail for purposes of clarity of understanding of the purport of the invention, and the present invention is not to be limited thereto unless otherwise specified.

Figure 3:
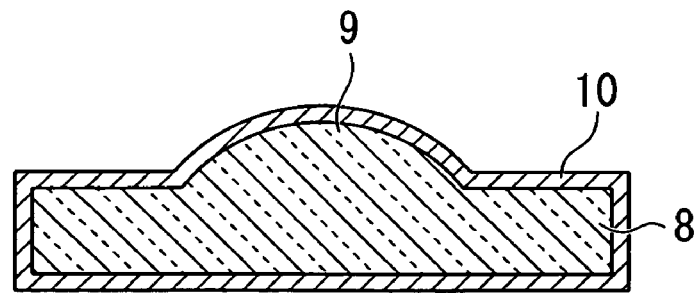
FIG. 3 is a sectional view showing an optical lens according to one embodiment of the present invention.

FIG. 3 is a sectional view showing an optical lens according to one embodiment of the present invention.

In the drawing, the reference numeral 1 denotes a tabular transparent base material made of a composition for sealing a light emitting element, 2 denotes a generally hemispherical microconvex lens portion formed on the surface (one surface) of the transparent base material 1, 3 denotes a hard coat film formed so as to coat the entire transparent base material 1 and convex lens portion 2, and the entire transparent base material 1 and convex lens portion 2 constitute a light transmitting region.

The composition for sealing a light emitting element is a composition for sealing a light emitting element in which tetragonal zirconia particles having a disperse particle diameter of 1 nm or more and 20 nm or less are dispersed in a transparent resin.

The zirconia particles were limited to tetragonal zirconia particles for the following reasons. In view of synthesis of fine particles, when the particle diameter of fine particles becomes smaller as 20 nm or less, a tetragon becomes more stable than a conventionally known monocline and has high hardness, and also mechanical characteristics of the inorganic oxide particle-containing resin composition can be improved. A composition for sealing a light emitting element containing zirconia particles in a resin shows high tenacity through volume expansion called martensitic transformation as compared with the case of adding monoclinic zirconia particles by adding tetragonal zirconia as a second phase of the composition for sealing a light emitting element.

The disperse particle diameter of tetragonal zirconia particles is limited to 1 nm or more and 20 nm or less for the following reasons. When the disperse particle diameter is less than 1 nm, crystallinity deteriorates and it becomes difficult to exhibit particle characteristics such as refractive index. In contrast, when the disperse particle diameter is more than 20 nm, transparency deteriorates when formed into a dispersion or a composition for sealing a light emitting element.

As described above, less light scattering occurs and transparency of the composite can be maintained in a composition for sealing a light emitting element composited with a resin since the tetragonal zirconia particles are nanometer-sized particles.

As a hard coat film, those obtained by dispersing tetragonal zirconia particles having a disperse particle diameter of 1 nm or more and 20 nm or less in a hard coat base material are preferably used.

The thickness of the hard coat film is preferably 0.1 μm or more and 100 μm or less, and particularly preferably 1 μm or more and 50 μm or less, so as to exhibit sufficient function suited for use as a hard coat film and to adversely affect various characteristics of an optical lens.

Examples of the hard coat base material include organic hard coat base materials such as acrylate-based, silicone-based and oxetane-based hard coat base materials; and inorganic hard coat base materials such as alkoxysilane-zirconate-based and alumina-based hard coat base materials. One or more kinds of these materials are used.

It is possible to use, as the organic hard coat base material, transparent resins having thermoplasticity, thermocurability, light (electromagnetic wave) curability through visible light, ultraviolet light or infrared light, and electron curability through irradiation with an electron.

Of the above hard coat base materials, acrylate-based and silicone-based hard coat base materials will be descried below.

Acrylate-Based Hard Coat Base Material

As the acrylate-based hard coat base material, a monofunctional acrylate and/or a polyfunctional acrylate are used, and one or more kinds of them are used.

Specific examples of the monofunctional acrylate and the polyfunctional acrylate are listed below.

(a) Examples of the aliphatic monofunctional (meth)acrylate include an alkyl (meth)acrylate such as butyl(meth)acrylate, lauryl(meth)acrylate or stearyl (meth)acrylate; an alkoxyalkylene glycol (meth)acrylate such a methoxypropylene glycol (meth)acrylate or ethoxydiethylene glycol (meth)acrylate; and an N-substitutedacrylamide such as (meth)acrylamide or N-butoxymethyl(meth)acrylamide.

(b) Examples of the aliphatic polyfunctional (meth)acrylate include an alkylene glycol di(meth)acrylate such as 1,6-hexanediol di(meth)acrylate, 1.4-butanediol di(meth)acrylate, ethylene glycol di(meth)acrylate, diethylene glycol di(meth)acrylate, triethylene glycol di(meth)acrylate, tetraethylene glycol di(meth)acrylate, tripropylene glycol di(meth)acrylate, neopentyl glycol di(meth)acrylate, polyethylene glycol di(meth)acrylate, or polybutanediol di(meth)acrylate; a tri(meth)acrylate such as pentaerythritol triacrylate, trimethylolpropane tri(meth)acrylate, ethylene oxide, or propylene oxide modified trimethylolpropane triacrylate; a tetra(meth)acrylate such as pentaerythritol tetraacrylate or di-trimethylolpropane tetraacrylate; and a penta(meth)acrylate such as dipentaerythritol (monohydroxy)pentaacrylate.

(c) Of the alicyclic (meth)acrylate, the monofunctional type alicyclic (meth)acrylate includes cyclohexyl(meth)acrylate, and the polyfunctional type alicyclic (meth)acrylate includes dicyclopentadienyl di(meth)acrylate.

(d) Of the aromatic (meth)acrylate, the monofunctional type aromatic (meth)acrylate includes phenyl(meth)acrylate, benzyl(meth)acrylate, phenoxyethyl (meth)acrylate, and phenoxydiethylene glycol (meth)acrylate, and the polyfunctional type aromatic (meth)acrylate includes diacrylates such as bisphenol A di(meth)acrylate, and bisphenol F di(meth)acrylate.

(e) Examples of the polyurethane (meth)acrylate include polyurethane ether (meth)acrylate and polyester (meth)acrylate.

(f) Examples of the epoxy(meth)acrylate include bisphenol A type epoxy acrylate and novolak type epoxy acrylate.

It is possible to use, as the photopolymerization initiator, acetophenones, benzophenones, ketals, anthraquinones, thioxanthones, an azo compound, peroxides, 2,3-dialkyldione compounds, disulfide compounds, thiuram compounds, and a fluoroamine compound.

Specific examples of the polymerization initiator include acetophenones such as 2,2'-diethoxyacetophenone, p-dimethylacetophenone, 1-hydroxycyclohexyl phenyl ketone, and 1-hydroxydimethyl phenyl ketone; benzoins such as benzoin methyl ether, benzoin ethyl ether, and benzoin isopropyl ether; benzophenones such as benzophenone, 2,4-dichlorobenzophenone, and p-chlorobenzophenone; peroxide-based polymerization initiators such as lauroyl peroxide, benzoyl peroxide, di-t-butyl peroxide, t-butyl-peroxy-2-ethyl hexanoate, t-butyl-peroxyisobutyrate, t-butyl-peroxypivalate, t-butyl-peroxybenzoate, and t-butyl-peroxyacetate; and azo-based polymerization initiators such as 2,2'-azobisisobutyronitrile.

Silicone-Based Hard Coat Base Material

It is possible to use, as the silicone-based hard coat base material, one or more kinds of compounds selected from organosilicon compounds represented by general formula (1) shown below and/or a partially hydrolyzed condensate thereof:

$$R_a\text{—}SiX_{4-a} \quad (1)$$

wherein R represents a monovalent organic group having 1 to 18 carbon atoms, X represents a hydrolyzable group, and a represents 0, 1 or 2.

Examples of R include a linear, branched or cyclic alkyl group such as a methyl group, an ethyl group, a propyl group, a butyl group, a hexyl group, an octyl group, a decyl group, a lauryl group, a cetyl group, a stearyl group, or a cyclohexyl group; an aryl group such as a phenyl group; an aralkyl group such as a benzyl group; an alkenyl group such as a vinyl group, an allyl group, a propenyl group, or a butenyl group.

It also includes those in which a portion or all of hydrogen atoms of these organic groups is/are substituted with an epoxy group, an amino group, a mercapto group, a (meth)acryloxy group, or a halogen atom such as a chlorine atom.

X may be a hydrolyzable group and examples thereof include an alkoxy group such as a methoxy group, an ethoxy group, a propoxy group, a butoxy group, or a phenoxy group, or a halogen atom such as a chlorine atom.

Examples of the organosilicon compound represented by general formula (I) include tetrachlorosilane, tetramethoxysilane, tetraethoxysilane, tetrabutoxysilane, methyltrimethoxysilane, dimethyldimethoxysilane, trimethylmethoxysilane, n-propyltrimethoxysilane, n-butyltriethoxysilane, n-hexyltrimethoxysilane, n-hexyltriethoxysilane, n-octyltriethoxysilane, n-decyltrimethoxysilane, vinyltrichlorosilane, vinyltrimethoxysilane, vinyltriethoxysilane, vinylmethyldichlorosilane, vinylmethyldimethoxysilane, vinylmethyldiethoxysilane, 5-hexenyltrimethoxysilane, 3-glycidoxypropylmethoxysilane, 3-glycidoxypropyltriethoxysilane, 3-glycidoxypropylmethyldimethoxysilane, 3-glycidoxypropylmethyldiethoxysilane, 3-(meth)acryloxypropyltrimethoxysilane, 3-(meth)acryloxypropyltriethoxysilane, 3-(meth)acryloxypropylmethyldimethoxysilane, 3-(meth)acryloxypropylmethyldiethoxysilane, phenyltrimethoxysilane, diphenyldimethoxysilane, p-styryltrimethoxysilane, 3-(4-vinylphenyl)propyltrimethoxysilane, 4-vinylphenylmethyltrimethoxysilane, 4-vinylphenyltrimethoxysilane, 3-aminopropyltrimethoxysilane, 3-acryloxypropyltrimethoxysilane, 3-methacryloxypropyltrimethoxysilane, 3-mercaptopropyltrimethoxysilane, and 3-mercaptopropyltriethoxysilane.

One or more kinds of these organosilicon compounds may be used, but it is necessary that the compound has a branched structure. Therefore, when using those in which a=2, a hydrolyzed condensate is converted into a linear oil, resulting in inferior hardness and scratch resistance. When using only those in which a=0, cracking may often occur and therefore, it is preferred to eliminate the case of using only those in which a=0 or a=2.

Those in which a=0 and those in which a=2 are used in combination, or those in which a=1, those in which a=0 and those in which a=2 are used in combination. An organosilicon compound containing at least those in which a=1 is preferably used.

As long as the objects of the present invention are not adversely affected, the silicone-based hard coat base material may contain heat-resistance improvers, dyes, pigments, and flame retardants as other optional components.

As long as the characteristics are not impaired, polymerization inhibitors, leveling agents, thickeners, discoloration inhibitors, ultraviolet absorbers, silane coupling agents, antistatic agents, tackifiers, antioxidants, releasants, inorganic fillers, heat-resistance improvers, dyes, and flame retardants may be added to the hard coat film.

The content of the tetragonal zirconia particles in the hard coat film is preferably 1% by weight or more and 80% by weight or less, more preferably 10% by weight or more and 80% by weight or less, and still more preferably 10% by weight or more and 50% by weight or less.

The content of the tetragonal zirconia particles is limited to 1% by weight or more and 80% by weight or less for the following reasons. 1% by weight as the lower limit is the minimum value which enables an improvement in a refractive index and mechanical characteristics, while 80% by weight as the upper limit is the maximum value of an addition rate which can maintain characteristics (flexibility, specific gravity) of the resin itself.

In the hard coat film, when the content of the tetragonal zirconia particles is 25% by weight and the light path length is 1 mm, the visible light transmittance is preferably 90% or more, and more preferably 92% or more.

The visible light transmittance varies depending on the content of the tetragonal zirconia particles in the hard coat film, and the visible light transmittance is 95% or more when the content of the tetragonal zirconia particles is 1% by weight, and is 80% or more when the content of the tetragonal zirconia particles is 40% by weight.

The refractive index of a resin can be further increased by dispersing tetragonal zirconia particles in the resin as compared with the refractive index of about 1.4 of the acrylate resin and the silicone resin and the refractive index of about 1.5 of the epoxy resin since the refractive index of the tetragonal zirconia particles is 2.15.

An improvement in tenacity through martensitic transformation can be expected for the tetragonal zirconia particles as compared with the monoclinic zirconia particles. Moreover, the tetragonal zirconia particles are suited for improvement of mechanical characteristics of the composite since the tetragonal zirconia particles have high tenacity and hardness.

Less light scattering occurs and transparency of the composite material can be maintained even when composited with the resin since the tetragonal zirconia particles are nanometer-sized particles.

The hard coat film was obtained by dispersing tetragonal zirconia particles having a disperse particle diameter of 1 nm or more and 20 nm or less in a transparent hard coat material, and thus transparency can be maintained and also the refractive index and tenacity are improved.

Thereby, transparency, the refractive index, thermostability, hardness and weatherability are improved and thus reliability is improved for a long period.

The method of forming the hard coat film will be described below.

In the case of forming the hard coat film, the following transparent inorganic oxide dispersion is used.

Transparent Inorganic Oxide Dispersion (Transparent Zirconia Dispersion)

The transparent inorganic oxide dispersion is a dispersion containing tetragonal zirconia particles having a disperse particle diameter of 1 nm or more and 20 nm or less, and a disperse medium.

The disperse medium basically contains at least one kind of water, an organic solvent, a liquid resin monomer, and a liquid resin oligomer.

It is possible to preferably use, as the organic solvent, alcohols such as methanol, ethanol, 2-propanol, butanol, and octanol; esters such as ethyl acetate, butyl acetate, ethyl lactate, propylene glycol monomethyl ether acetate, propylene glycol monoethyl ether acetate, and γ-butyrolactone; ethers such as diethylether, ethylene glycol monomethyl ether (methyl cellosolve), ethylene glycol monoethyl ether (ethyl cellosolve), ethylene glycol monobutyl ether (butyl cellosolve), diethylene glycol monomethyl ether, and diethylene glycol monoethyl ether; ketones such as acetone, methyl ethyl ketone, methyl isobutyl ketone, acetylacetone, and cyclohexanone; aromatic hydrocarbons such as benzene, toluene, xylene, and ethylbenzene; and amides such as dimethylformamide, N,N-dimethylacetoacetamide, and N-methylpyrrolidone. Of these solvents, one or more kinds of solvents can be used.

As the liquid resin monomer, an acrylic or methacryl-based monomer such as methyl acrylate or methyl methacrylate, and an epoxy-based monomer are preferably used.

As the liquid resin oligomer, a urethane acrylate-based oligomer, an epoxy acrylate-based oligomer, and an acrylate-based oligomer are preferably used.

The content of the tetragonal zirconia particles is preferably 1% by weight or more and 70% by weight or less, more preferably 1% by weight or more and 50% by weight or less, and still more preferably 5% by weight or more and 30% by weight or less.

The content of the tetragonal zirconia particles is limited to 1% by weight or more and 70% by weight or less for the following reasons. This range is a range which enables good dispersion state of the inorganic oxide particles. When the content is less than 1% by weight, the effect of the tetragonal zirconia particles decreases. In contrast, when the content is more than 70% by weight, gelation and aggregation/precipitation occur and a feature as the dispersion disappears.

As long as the characteristics are not impaired, the transparent inorganic oxide dispersion may contain other inorganic oxide particles, dispersing agents, dispersant aids, coupling agents, and resin monomers.

Examples of the inorganic oxide particles other than the tetragonal zirconia particles include monoclinic or cubic zirconia particles, titanium oxide, zinc oxide, cerium oxide, tin oxide, antimony-added tin oxide (ATO), and tin-added indium oxide (ITO).

Examples of the dispersing agent include a phosphate-based dispersing agent.

Examples of the surface treating agent include a silane coupling agent and a phosphate-based dispersing agent.

When the content of the tetragonal zirconia particles is 5% by weight and the light path length is 10 mm, the visible light transmittance of the transparent inorganic oxide dispersion is preferably 90% or more, and more preferably 95% or more.

The visible light transmittance varies depending on the content of the tetragonal zirconia particles, and the visible light transmittance is 95% or more when the content of the tetragonal zirconia particles is 1% by weight, and is 80% or more when the content of the tetragonal zirconia particles is 40% by weight.

Method for Forming Hard Coat Film

The above transparent inorganic oxide dispersion is mixed with a monomer or an oligomer of a resin using a mixer to prepare a resin composition in an easily flowable state.

Then, the resin composition is applied so as to coat the entire transparent base material 1 and convex lens portion 2 using various coating methods such as a spin coating method, a bar coating method, a low coating method, and a dip coating method to form a hard coat film.

When the monomer or oligomer of the resin contains a carbon double bond (C=C) having reactivity, it can be polymerized and formed into a resin only by mixing.

The method of curing a resin composition containing an ultraviolet-(UV) curable resin such as an acrylic resin includes various methods, and typical examples thereof include a mold forming method using a radical polymerization reaction which is initiated by heating or irradiation with light, and a transfer molding method. Examples of the radical polymerization reaction include a polymerization reaction (thermopolymerization) using heat, a polymerization reaction (photopolymerization) using ultraviolet light, a polymerization reaction using a gamma (γ) ray, or a combination thereof.

When a silicone resin is used, a hard coat film can be formed by mixing one or plural kinds of organosilicon compounds, curing agents and catalysts to prepare a coating material, applying the coating material so as to coat the entire transparent base material 1 and convex lens portion 2, and curing the coating material. A reaction such as condensation crosslinking can be used as the thermocuring reaction.

Thus, an optical lens of the present embodiment shown in FIG. 3 can be produced.

As described above, according to the present embodiment, the light transmittance, the refractive index, thermostability, hardness and weatherability can be improved since a hard coat film 3 containing tetragonal zirconia particles having a disperse particle diameter of 1 nm or more and 20 nm or less dispersed in a hard coat base material is formed.

Therefore, an optical lens having a high light transmittance, a high refractive index, high thermostability, high hardness and excellent weatherability can be provided.

In the present embodiment, the hard coat film 3 was formed so as to coat the entire transparent base material 1 and convex lens portion 2 of the optical lens. The hard coat film 3 may be formed in a light transmitting region of the optical lens, and may be formed only in the convex lens portion 2.

The hard coat film 3 may be formed on an optical component other than the optical lens, for example, a microlens array.

It is also possible to use as an optical functional film by laminating the hard coat film 3 with a film having another function, for example, an anti-reflective film or an electromagnetic shielding film.

Furthermore, when the optical lens of the present embodiment is applied to an optical component such as a projector, the light transmittance, the refractive index, thermostability, hardness and weatherability of the optical lens are improved, and thus entire performances of the optical component can be improved and reliability of the optical component can be improved for a long period.

Examples

The present invention will now be described in detail below by way of Examples and Comparative Examples, but the present invention is not limited to the following Examples.

Example 20

Preparation of Transparent Inorganic Oxide Dispersion (Transparent Zirconia Dispersion)

In the same manner as in Example 1, particles were synthesized to produce zirconia particles.

The crystal system of zirconia particles was examined using an X-ray diffractometer. As a result, an X-ray diffraction pattern (chart) shown in FIG. 1 revealed that the crystal system of zirconia particles is a tetragonal system.

To 10 g of the tetragonal zirconia particles, 87 g of methyl ethyl ketone as a disperse medium and 10 g of a "silane coupling agent system" (KBM-503, manufactured by Shin-Etsu Chemical Co., Ltd.) as a surface modifier were added, followed by mixing. Then, a dispersion treatment was carried out by a beads mill using zirconia beads having a φ of 0.1 mm to prepare a transparent inorganic oxide dispersion (Z14) in which the disperse particle diameter is 1 nm or more and 20 nm or less.

(Formation of Hard Coat Film)

To 100 g of the above transparent inorganic oxide dispersion (Z14), 5 g of 1,6-hexanediol diacrylate, 2.5 g of pentaerythritol triacrylate, 2 g of pentaerythritol tetraacrylate, 0.5 g of benzoyl peroxide as a polymerization initiator and 10 g of diacetone alcohol were added to prepare a curable acrylate solution.

The solution was applied on an acryl substrate measuring 100×100×2 mm using a bar coating method and then cured by heating at 120° C. for 2 hours to form a hard coat film having a thickness of 3 μm of Example 20. The content of the zirconia particles of the hard coat film was 50% by weight.

Example 21

To 100 g of the transparent inorganic oxide dispersion (Z14) of Example 20, 7 g of methyltriethoxysilane and 3 g of 3-glycidoxypropyltrimethoxysilane were added, followed by stirring at 5° C. for 2 hours, stirring at 60° C. for 4 hours and further aging. To the aged solution, 10 g of diacetone alcohol was added to prepare a curable silicone compound solution.

The solution was applied on an acryl substrate measuring 100×100×2 mm using a bar coating method and then cured by heating at 120° C. for 2 hours to form a hard coat film having a thickness of 3 μm of Example 21. The content of the zirconia particles of the hard coat film was 50% by weight.

Comparative Example 42

In the same manner as in Example 20, except that RC-100 (manufactured by DAIICHI KIGENSO KAGAKU KOGYO CO., LTD.) containing monoclinic and tetragonal zirconia particles was used as zirconia particles, a dispersion treatment was carried out to prepare a zirconia dispersion (Z15) of Comparative Example 42. The average disperse particle diameter of the zirconia particles was 100 nm.

To the zirconia dispersion (Z15), 1,6-hexanediol diacrylate used in Example 20, pentaerythritol triacrylate, pentaerythritol tetraacrylate, benzoyl peroxide as a polymerization initiator, and diacetone alcohol were added to prepare a curable acrylate solution.

In the same manner as in Example 20, the curable acrylate solution was treated to form a hard coat film of Comparative Example 42. The content of the zirconia particles of the hard coat film was adjusted to 50% by weight.

Comparative Example 43

To the zirconia dispersion (Z15) of Comparative Example 42, methyltriethoxysilane used in Example 21 and 3-glycidoxypropyltrimethoxysilane were added, followed by stirring at 5° C. for 2 hours, stirring at 60° C. for 4 hours and further aging. To the aged solution, diacetone alcohol was added to prepare a curable silicone compound solution.

In the same manner as in Example 21, the curable silicone compound solution was treated to form a hard coat film of Comparative Example 43. The content of the zirconia particles of the hard coat film was adjusted to 50% by weight.

Comparative Example 44

In the same manner as in Comparative Example 42, a curable acrylate solution was prepared. In the same manner as in Example 20, a hard coat film of Comparative Example 44 was formed. The content of the zirconia particles of the hard coat film was adjusted to 2% by weight.

Comparative Example 45

In the same manner as in Comparative Example 43, a curable acrylate solution was prepared. In the same manner as in Example 21, a hard coat film of Comparative Example 45 was formed. The content of the zirconia particles of the hard coat film was adjusted to 2% by weight.

Evaluation of Hard Coat Film

With respect to the hard coat films of Examples 20 and 21 and Comparative Examples 42 to 45, the three items visible light transmittance, refractive index and hardness were evaluated by the following apparatuses and procedures.

(1) Visible Light Transmittance

Using a spectrophotometer (manufactured by JASCO Corporation), light transmittance of visible light was measured.

A hard coat film having a thickness of 3 μm formed on an acrylic substrate measuring 100×100×2 mm was used as a measuring sample. Samples having a light transmittance of 92% or more were rated "Good", whereas, samples having a light transmittance of less than 92% were rated "Poor" when the light transmittance of the acrylic substrate is 100%.

(2) Refractive Index

Each of the curable acrylate solutions or curable silicone compound solutions obtained in Examples 20, 21 and Comparative Examples 42 to 45 was applied on a silicone wafer using a spin coating method and the refractive index was measured using a spectral ellipsometer.

A resin containing no zirconia added therein was used as a standard sample. Samples where the refractive index was improved by 0.05 or more were rated "Good", whereas, samples where the refractive index was improved by less than 0.05 were rated "Poor".

(3) Hardness

In accordance with Japanese Industrial Standard: JIS K 5600-5-4 "Mechanical Properties-Scratch Hardness (Pencil Method) of Coating Film", hardness was measured.

The hardness of each hard coat film containing 50% by weight of zirconia particles formed by using the zirconia dispersion (Z15) of Comparative Example 42 was used as a standard. Samples having a hardness higher than the standard value were rated "Good", whereas, samples having a hardness lower than the standard value were rated "Poor".

The above evaluation results are shown in Table 10.

TABLE 10

| | Kind of dispersion | Kind of composition in solution | Content of zirconia particles (% by weight) | Visible light transmittance (%) | Refractive index | Hardness |
|---|---|---|---|---|---|---|
| Example 20 | Z14 | Acrylate | 50 | Good | Good | Good |
| Example 21 | Z14 | Silicone | 50 | Good | Good | Good |
| Comparative Example 42 | Z15 | Acrylate | 50 | Poor | Good | Standard |
| Comparative Example 43 | Z15 | Silicone | 50 | Poor | Good | Standard |
| Comparative Example 44 | Z15 | Acrylate | 2 | Good | Poor | Poor |
| Comparative Example 45 | Z15 | Silicone | 2 | Good | Poor | Poor |

As is apparent from these evaluation results, visible light transmittance, refractive index and hardness are excellent in Examples 20 and 21.

In Comparative Example 42 to 45, any one characteristic of visible light transmittance, refractive index and hardness was inferior as compared with Examples 20 and 21.

INDUSTRIAL APPLICABILITY

The transparent inorganic oxide dispersion of the present invention contains inorganic oxide particles which have a surface modified with a surface modifier having one or more reactive functional groups and have a disperse particle diameter of 1 nm or more and 20 nm or less, thereby, it is possible to improve the refractive index and mechanical characteristics of the composition for sealing a light emitting element, which contains the inorganic oxide particles and a resin, and to maintain transparency. Therefore, the transparent inorganic oxide dispersion exerts a great effect in various industrial fields, including sealing materials of semiconductor lasers (LED); optical sheets of substrates for liquid crystal display devices, substrates for organic EL display devices, substrates for color filters, substrates for touch panels, and substrates for solar batteries; transparent plates; optical lenses; optical elements, and light guides.

The transparent inorganic oxide dispersion of the present invention contains tetragonal zirconia particles which have a surface modified with a surface modifier and have a disperse particle diameter of 1 nm or more and 20 nm or less, and thereby, it is possible to improve the refractive index and mechanical characteristics of the composition for sealing a light emitting element, which contains the inorganic oxide particles and a resin, and to maintain transparency. Therefore, the transparent inorganic oxide dispersion exerts a great effect in various industrial fields, including sealing materials of semiconductor lasers (LED); optical sheets of substrates for liquid crystal display devices, substrates for organic EL display devices, substrates for color filters, substrates for touch panels, and substrates for solar batteries; transparent plates; optical lenses; optical elements, and light guides.

The composition for sealing a light emitting element of the present invention contains inorganic oxide particles having a disperse particle diameter of 1 nm or more and 20 nm or less and a refractive index of 1.8 or more, and a silicone resin, and thereby, light transmittance, refractive index, thermostability, hardness and weatherability could be improved. Therefore, the composition for sealing a light emitting element exerts an extremely great effect of improving characteristics of a light emitting diode (LED) and also exerts a great effect in the fields of various devices using this light emitting diode, and thus the industrial effect is extremely great.

The inorganic oxide particle-containing resin composition of the present invention contains zirconia particles which have a surface modified with a surface modifier and have a disperse particle diameter of 1 nm or more and 20 nm or less, and a hydrogenated epoxy resin obtained by hydrogenating an aromatic ring of an aromatic epoxy resin, and thereby the light transmittance, the refractive index, thermostability, hardness and weatherability could be improved. Therefore, the composition for sealing a light emitting element exerts an extremely great effect of improving characteristics of a light emitting diode (LED) and also exerts a great effect in various fields requiring the above physical properties, and thus the industrial effect is extremely great.

The inorganic oxide particle-containing transparent plastic member of the present invention is obtained by dispersing fine zirconia particles, which have a surface modified with a surface modifier and have a disperse particle diameter of 1 nm or more and 20 nm or less, in a film- or sheet-like plastic, and thereby, it is possible to enhance the refractive index and transparency of a film- or sheet-like plastic member and to improve mechanical characteristics. Therefore, the inorganic oxide particle-containing transparent plastic member exerts a great effect naturally for, including composite plastic members, display substrates or functional films of flat panel displays (FPD) such as liquid crystal displays (LCD), plasma displays (PDP), electroluminescence displays (EL) and surface electric field displays (SED) and also for lens sheets such as microarray lens sheets in the optical field, prism sheets, Fresnel lens, and lenticular lens; light transmission plates, diffusing films; holographic substrates; and light control films.

The hard coat film of the present invention contains tetragonal zirconia particles having a disperse particle diameter of 1 nm or more and 20 nm or less, thereby, transparency could be maintained and also a refractive index and tenacity could be improved. Therefore, the hard coat film exerts a great effect in various industrial fields to which the hard coat film is applied, including various equipment, for example, various cameras such as a film-integrated camera (e.g. film with camera and lens) and a video camera; optical pickups such as a CD, a CD-ROM, a MD (MO is an error), a CD-R, a CD-Video, and a DVD; and OA equipment such as copying machines and printers.

The invention claimed is:

1. A transparent tetragonal zirconia dispersion comprising tetragonal zirconia particles which have a surface modified with a surface modifier having one or more reactive functional groups and have a disperse particle diameter of 1 nm or more and 20 nm or less,
    wherein a weight ratio of a modified moiety of the surface of the tetragonal zirconia particles is 5% by weight or more and 200% by weight or less of the tetragonal zirconia particles, and
    visible light transmittance at a light path length of 10 mm is 80% or more when the content of the tetragonal zirconia particles is 5% by weight.

2. The transparent tetragonal zirconia dispersion according to claim 1, wherein the reactive functional group has a carbon-carbon double bond or a silicon-hydrogen bond.

3. The transparent tetragonal zirconia dispersion according to claim 1, wherein the reactive functional groups are one or more kinds selected from the group consisting of an alkoxyl group, a hydroxyl group, a vinyl group, a styryl group, an acryl group, a methacryl group, an acryloyl group and an epoxy group.

4. The transparent tetragonal zirconia dispersion according to claim 1, wherein the surface modifier is one or more kinds selected from the group consisting of an alkoxysilane compound, a chlorosilane compound, an alkylalkoxysilane compound, an alkylchlorosilane compound, a siloxane compound, a surfactant and a titanium coupling agent.

5. The transparent tetragonal zirconia dispersion according to claim 4, wherein the alkoxysilane compound or chlorosilane compound is a silane coupling agent.

6. The transparent tetragonal zirconia dispersion according to claim 4, wherein the siloxane compound is a modified silicone or a silicone resin.

7. The transparent tetragonal zirconia dispersion according to claim 1, wherein the content of the tetragonal zirconia particles is 1% by weight or more and 70% by weight or less.

8. A tetragonal zirconia particle-containing resin composition comprising tetragonal zirconia particles obtained from the transparent tetragonal zirconia dispersion according to claim 1, and a resin.

9. The tetragonal zirconia particle-containing resin composition according to claim 8, wherein the tetragonal zirconia particles are not only dispersed in the resin, but also reacted with the resin.

10. A composition for sealing a light emitting element, comprising the tetragonal zirconia particle-containing resin composition according to claim 9.

11. The composition for sealing a light emitting element according to claim 10, wherein a refractive index of the tetragonal zirconia particles is 1.8 or more and the resin is a silicone resin.

12. The tetragonal zirconia particle-containing resin composition according to claim 8, wherein the resin is a silicone resin, an epoxy resin, or an acrylic resin.

13. The tetragonal zirconia particle-containing resin composition according to claim 12, wherein the epoxy resin is a hydrogenated epoxy resin obtained by hydrogenating an aromatic ring of an aromatic epoxy resin.

14. The tetragonal zirconia particle-containing resin composition according to claim 13, wherein the content of the zirconia particles is 10% by weight or more and 60% by weight or less.

15. The tetragonal zirconia particle-containing resin composition according to claim 8, wherein the content of the tetragonal zirconia particles is 1% by weight or more and 80% by weight or less.

16. A composition for sealing a light emitting element, comprising the tetragonal zirconia particle-containing resin composition according to claim 8.

17. The composition for sealing a light emitting element according to claim 16, wherein light transmittance of light having a wavelength 350 nm or more and 800 nm or less is 80% or more when the content of tetragonal zirconia particles is 10% by weight or more and 60% by weight or less.

18. A light emitting element wherein at least a light transmitting region is sealed with the composition for sealing a light emitting element according to claim 16.

19. An optical semiconductor device comprising the light emitting element according to claim 18.

20. A method for producing a tetragonal zirconia particle-containing resin composition, which comprises mixing the transparent tetragonal zirconia dispersion according to claim 1 with a resin, molding or filling the resulting mixture, and curing the resulting molded article or filling material.

21. A tetragonal zirconia particle-containing transparent plastic member, which is a film- or sheet-like transparent plastic member, comprising tetragonal zirconia particles obtained from the transparent tetragonal zirconia dispersion according to claim 1.

22. The tetragonal zirconia particle-containing transparent plastic member according to claim 21, wherein the content of the tetragonal zirconia particles is 10% by weight or more and 80% by weight or less.

23. The tetragonal zirconia particle-containing transparent plastic member according to claim 21, wherein visible light transmittance is 80% or more when the thickness is adjusted to 30 μm or more and 300 μm or less.

24. A composite plastic member comprising the tetragonal zirconia particle-containing transparent plastic member according to claim 21.

25. A hard coat film comprising tetragonal zirconia particles obtained from the transparent tetragonal zirconia dispersion according to claim 1.

26. The hard coat film according to claim 25, wherein the tetragonal zirconia particles are dispersed in a hard coat base material.

27. The hard coat film according to claim 25, wherein the content of the tetragonal zirconia particles is 1% by weight or more and 80% by weight or less.

28. An optical functional film comprising at least the hard coat film according to claim 25 in a light transmitting region.

29. An optical lens comprising at least the hard coat film according to claim 25 in a light transmitting region.

30. An optical component comprising the optical lens according to claim 29.

* * * * *